(12) United States Patent
Tsukada

(10) Patent No.: US 7,755,468 B2
(45) Date of Patent: Jul. 13, 2010

(54) CHIP RESISTOR AND MANUFACTURING METHOD THEREFOR

(75) Inventor: Torayuki Tsukada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 170 days.

(21) Appl. No.: 12/002,751

(22) Filed: Dec. 18, 2007

(65) Prior Publication Data
US 2008/0272879 A1 Nov. 6, 2008

Related U.S. Application Data

(62) Division of application No. 10/521,908, filed on Jan. 20, 2005, now Pat. No. 7,330,099.

(51) Int. Cl.
*H01C 10/00* (2006.01)
(52) U.S. Cl. .................. 338/195; 338/332
(58) Field of Classification Search ............. 338/22 R, 338/307, 309, 327, 328, 332, 195
See application file for complete search history.

(56) References Cited

U.S. PATENT DOCUMENTS

| | | | |
|---|---|---|---|
| 5,548,269 A | 8/1996 | Katsuno et al. | |
| 6,172,591 B1 * | 1/2001 | Barrett | 338/22 R |
| 6,188,308 B1 * | 2/2001 | Kojima et al. | 338/22 R |
| 6,261,927 B1 | 7/2001 | Natarajan et al. | |
| 6,651,315 B1 * | 11/2003 | Graves et al. | 29/621 |
| 6,854,176 B2 * | 2/2005 | Hetherton et al. | 29/623 |

FOREIGN PATENT DOCUMENTS

| | | |
|---|---|---|
| JP | 54-73260 | 6/1979 |
| JP | 60-49611 | 3/1985 |
| JP | 05225892 | 9/1993 |
| JP | 6-36901 | 2/1994 |
| JP | 6-215908 | 8/1994 |
| JP | 7-29704 | 1/1995 |
| JP | 11-97203 | 9/1999 |
| JP | 11-260601 | 9/1999 |
| JP | 2001-2475 | 1/2001 |
| JP | 2002-57009 | 2/2002 |
| JP | 2002-184601 | 6/2002 |

* cited by examiner

*Primary Examiner*—Kyung Lee
(74) *Attorney, Agent, or Firm*—Hamre, Schumann, Mueller & Larson, P.C.

(57) ABSTRACT

A chip resistor includes a resistive element (1), an insulation layer (4) formed in a back surface of the flat surface, and two electrodes (3) spaced from each other via the insulation layer. Each electrode (3) makes contact with the insulation layer (4). Each electrode (3) has a lower surface formed with a solder layer (39).

5 Claims, 24 Drawing Sheets

CHIP RESISTOR AND MANUFACTURING METHOD THEREFOR

CROSS REFERENCE TO RELATED APPLICATIONS

This application is a division of U.S. Ser. No. 10/521,908, filed Jan. 20, 2005, now U.S. Pat. No. 7,330,099 which is incorporated herein by reference.

TECHNICAL FIELD

The present invention relates to chip resistors and manufacturing methods therefor.

BACKGROUND ART

An example of conventional chip resistors is disclosed in JP-A 2002-57009. FIG. 26 of the present application is a sketch of the resistor disclosed in the gazette (The entire resistor is indicated by a reference symbol B). The chip resistor B includes a rectangular resistive element 90 made of metal, and a pair of electrodes 91 formed on a lower surface of the resistive element 90. The two electrodes 91 are spaced from each other by a distance s5. Each electrode 91 has a solder layer 92 formed thereon.

The chip resistor B is manufactured by means of a method shown in FIGS. 27A-27E. First, two metal plates 94, 95 are prepared (FIG. 27A), and the metal plate 95 is bonded to a lower surface of the metal plate 94 (FIG. 27B). The upper metal plate 94 has a relatively larger electric resistance than the lower metal plate 95. The lower metal plate 95 is made of copper for example, and has a smaller electric resistance. Next, part of the lower metal plate 95 is ground off by machining, to form a gap 93 (FIG. 27C). On the remaining portion of the metal plate 95 is formed a solder layer 96 (FIG. 27D). Finally, the metal plate 94 (and the related members 95, 96) are cut into chip resistors B.

According to the conventional method of manufacture described above, the chip resistor B has its electrodes 91 (FIG. 26) formed by mechanical grinding of the lower metal plate 95 (FIGS. 27B, 27C). As will be understood easily, in order for the device B to function properly as a resistor, it is not preferable that part of the electrically conductive metal plate 95 is left between the two electrodes 91. Therefore, the depth of grinding into the metal plate 95 must be at least the same as the thickness of the metal plate 95. However, it is not easy in general to make such an operational setting accurately.

If the grinding depth is greater than the thickness of the metal plate 95, the upper metal plate 94 is ground partially, which alters the resistance value. Further, in mechanical grinding, it is difficult to achieve an exact dimension for the distance s5 between the two electrodes 91, and therefore a certain level of error is unavoidable.

For these reasons, a trimming operation is performed to the conventional chip resistor B in order to make adjustment to the resistance value. However, performing the trimming to all of the resistors which are manufactured leads to increased cost of manufacture.

DISCLOSURE OF THE INVENTION

The present invention was made under the above-described circumstances, and it is therefore an object of the present invention to provide a chip resistor which is easier to manufacture than before, and does not need the resistance value adjustment. Another object of the present invention is to provide a method for manufacturing such a chip resistor.

A first aspect of the present invention provides a chip resistor which includes: a resistive element having a flat surface; an insulation layer provided in the flat surface; and a plurality of electrodes provided in the flat surface. The electrodes make contact with the insulation layer and are spaced from each other via the insulation layer.

Preferably, the insulation layer is formed of a resin material by thick-film printing.

Preferably, the resistive element has another surface facing away from the flat surface. This another surface is formed with an electrically insulating overcoat layer.

Preferably, the overcoat layer and the insulation layer are of the same material.

Preferably, the electrodes have a greater thickness than the insulation layer.

Preferably, the electrodes are formed with a solder layer thereon.

A second aspect of the present invention provides a method of making a chip resistor. This method includes: a step of forming an insulating pattern on an electrically resistive plate; a step of forming an electrical conductor in contact with the insulating pattern, on the plate; and a step of dividing the plate into a plurality of chips. Each of the chips includes at least part of the insulating pattern and at least part of the conductor.

Preferably, the plate is a flat metal plate which has a uniform thickness. Further, the insulating pattern is formed by thick-film printing, and the electrical conductor is formed by plating.

Preferably, the method according to the present invention further includes a step of forming an electrically insulating overcoat layer on the plate before dividing the plate.

Preferably, the plate is divided by blanking, with a single punch die.

A third aspect of the present invention provides a chip resistor which includes: a chip-like resistive element having an upper surface and a back surface facing away from each other in a direction of thickness; a plurality of electrodes provided in the resistive element; and an insulation layer formed in at least one of the upper surface and the back surface of the resistive element, between the electrodes. The resistive element includes a plurality of upright surfaces which extend in the direction of thickness. Each of the electrodes is provided correspondingly in one of the upright surfaces.

Preferably, the resistive element includes a plurality of recesses formed by the upright surfaces.

Preferably, the recesses are filled by the electrodes.

Preferably, the resistive element includes a plurality of through holes defined by the upright surfaces.

Preferably, the through holes are filled by the electrodes.

Preferably, the electrodes extend in the direction of thickness, beyond the insulation layer.

Preferably, each of the electrodes is formed with a solder layer.

A fourth aspect of the present invention provides a method of making a chip resistor. This method includes: a step of forming an insulation layer on an electrically resistive plate; a step of forming a plurality of through holes in the plate; a step of plating a conductor in each of the through holes; and a step of dividing the plate into a plurality of chips.

Preferably, the through holes are divided in the step of dividing the plate.

Preferably, the through holes are formed by punching.

BEST MODE FOR CARRYING OUT THE INVENTION

Hereinafter, preferred embodiments of the present invention will be described with reference to the drawings.

Figure 1:
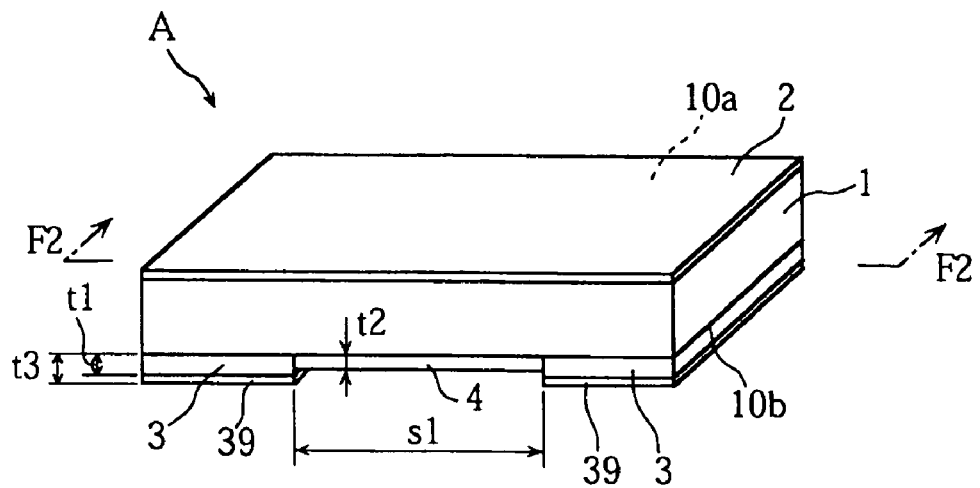
FIG. 1 is a perspective view of a chip resistor according to a first embodiment of the present invention.
Figure 2:
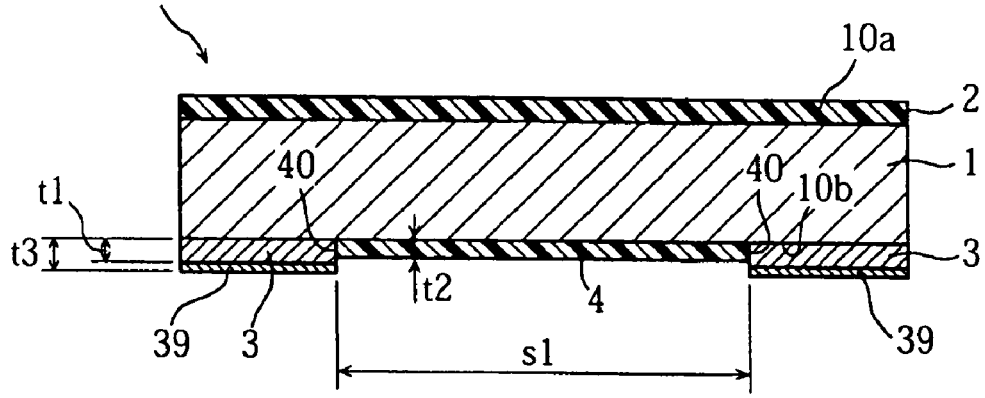
FIG. 2 is a sectional view taken in lines F2-F2 in FIG. 1.
Figure 3:
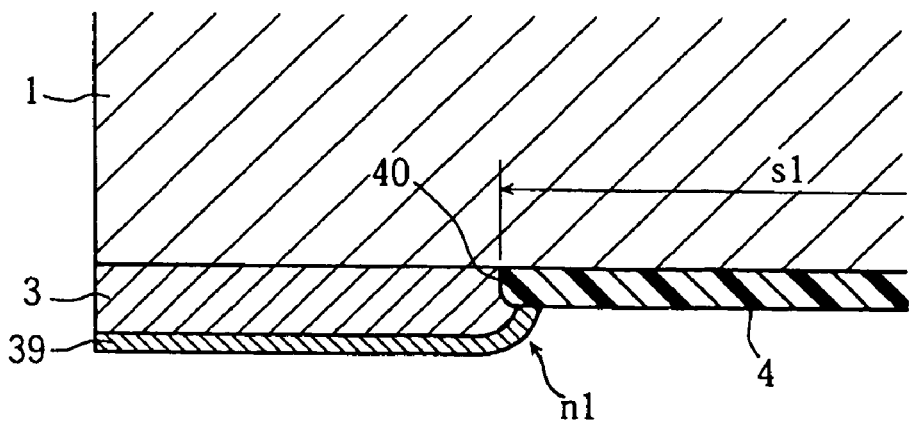
FIG. 3 is an enlarged view of a portion of the chip resistor in FIG. 2.

FIG. 1 through FIG. 3 show a chip resistor A according to a first embodiment of the present invention. As shown in FIG. 1 and FIG. 2, the chip resistor A includes a resistive element 1, an overcoat layer 2, a pair of electrodes 3, and an insulating spacer 4.

The resistive element 1 is a rectangular metal chip. As will be understood from FIG. 2, the resistive element 1 has a uniform thickness. The resistive element 1 is made of e.g. a Cu—Mn alloy, a Ni—Cu alloy and a Ni—Cr alloy. Alternatively, the resistive element 1 can be formed of a nonmetal material.

The overcoat layer 2 is electrically insulating, and covers an upper surface 10a of the resistive element 1. The overcoat layer 2 can be formed of epoxy resin by thick-film printing.

The pair of electrodes 3 are on a back surface 10b of the resistive element 1, and are spaced from each other by a predetermined distance s1. The electrodes 3 can be formed by plating copper on the resistive element 1. Each electrode 3 has a lower surface formed with a solder layer 39.

The spacer 4 is provided between the two electrodes 3. As shown in FIG. 2, the spacer 4 has two end faces 40 which are facing away from each other and spaced by the distance s1. Each end face 40 makes tight contact with one of the electrode 3. The spacer 4 can be formed of the same electrically insulating material and by the same method as used for the overcoat layer 2.

In FIG. 2, the solder layer 39 is illustrated as completely separated from the spacer 4 for the sake of simplicity. Actually however, the solder layer 39 extends to touch a lower surface of the spacer 4 as shown in FIG. 3 (See reference code n1). As mentioned earlier, the spacer 4 is electrically insulating. Therefore, the contact between the solder layer 39 and the spacer 4 does not does not alter the desired resistance value between the two electrodes 3.

As shown in FIG. 2, a thickness t1 of each electrode 3 is made greater than a thickness t2 of the spacer 4. Therefore, a total thickness t3 of the electrode 3 and the solder layer 39 is also greater than the thickness t2 of the spacer 4. Specifically, the thickness t1 is 30 μm approx, the thickness t2 is 20 μm approx, and the thickness t3 is 35 μm approx. (i.e. the thickness of the solder layer 39 is 5 μm approx.)

The overcoat layer 2 has the same thickness as the spacer 4 or 20 μm approx. The resistive element 1 has a thickness in a range of 0.1 mm through 1 mm approx, and a length and a width each falling somewhere in a range of 2 mm through 7 mm. The chip resistor A has a resistance value in a range of 0.5Ω through 50 mΩ approx.

Next, description will be made for how the chip resistor A can be manufactured, with reference to FIG. 4A through FIG. 4E and FIG. 5.

Figure 4A:
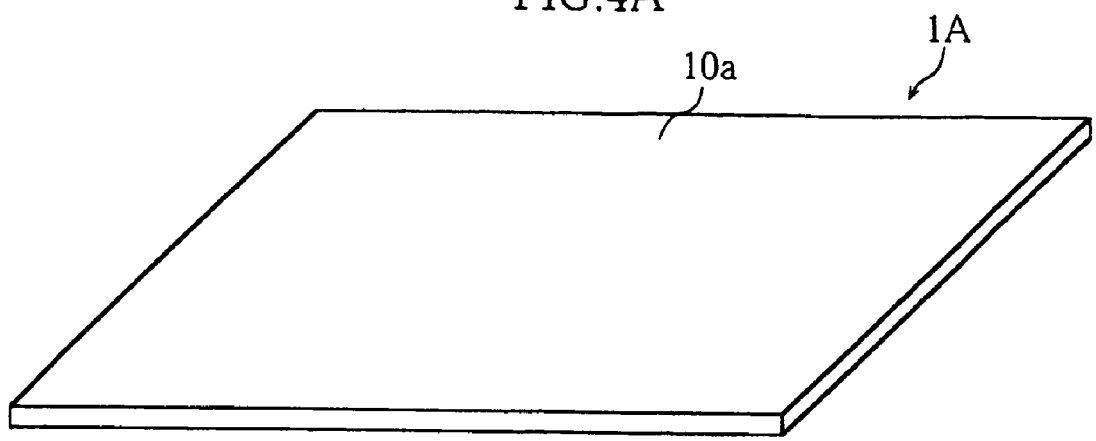
FIG. 4A through FIG. 6 illustrate a method of manufacturing the chip resistor according to the first embodiment of the present invention.

First, as shown in FIG. 4A, a metal plate 1A which has a uniform thickness is prepared. The plate 1A has an appropriate size in order to yield a plurality of rectangular resistive elements (each of which corresponds to the resistive element 1). The plate 1A has a flat upper surface 10a and a flat back surface (indicated by a reference code 10b in FIG. 4C).

Figure 4B:
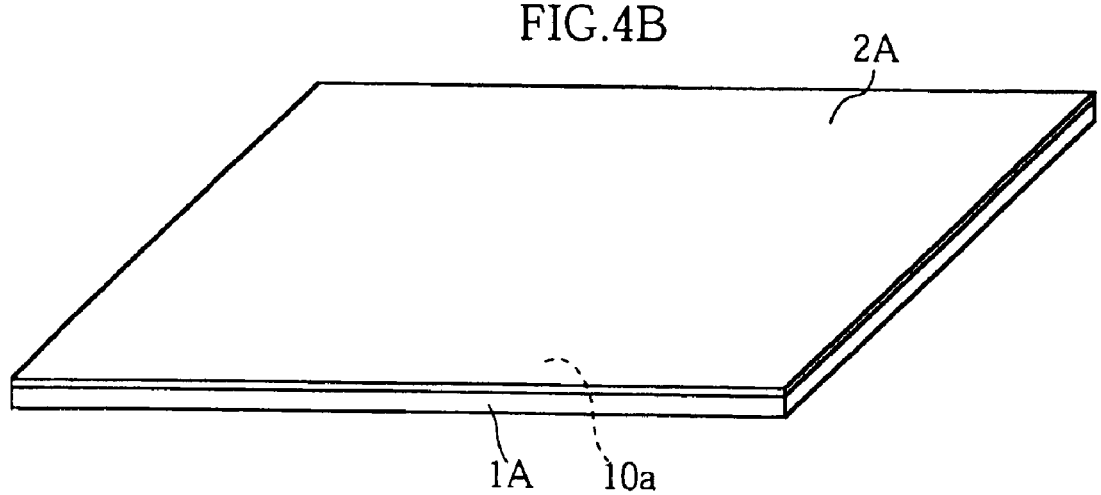

As shown in FIG. 4B, a coat layer 2A is formed on the upper surface 10a of the plate 1A. The coat layer 2A can be formed of a resin by thick-film printing. The formed coat layer 2A may receive a predetermined marking operation.

Figure 4C:
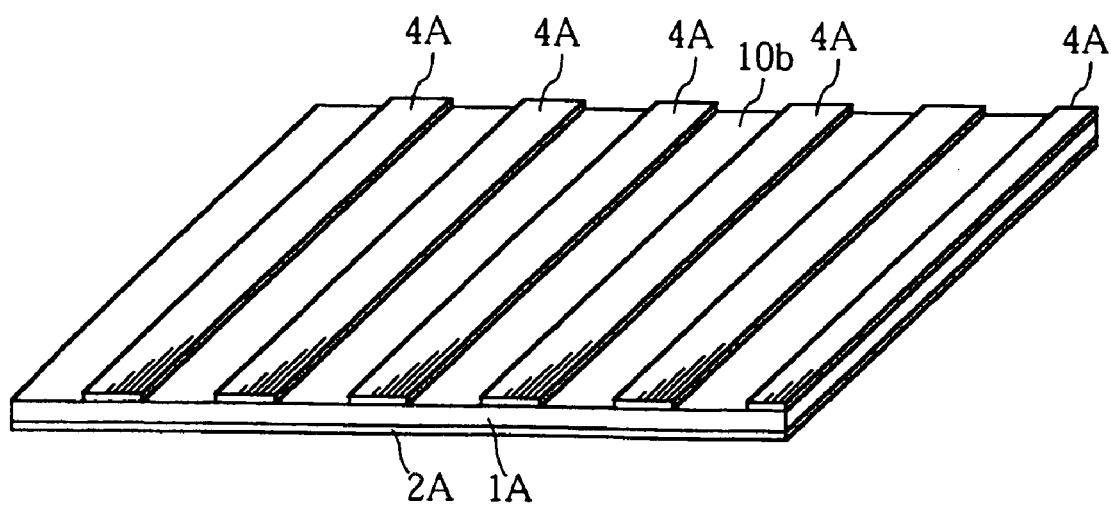

As shown in FIG. 4C, a plurality of parallel partitions 4A are formed on the back surface 10b of the plate 1A. These partitions 4A can be formed by thick-film printing, using the same resin material as used for the formation of the coat layer 2A. The thick-film printing enables to form each partition 4A accurately to a desired size, and further, to dispose each partition 4A accurately at a desired position.

Figure 4D:
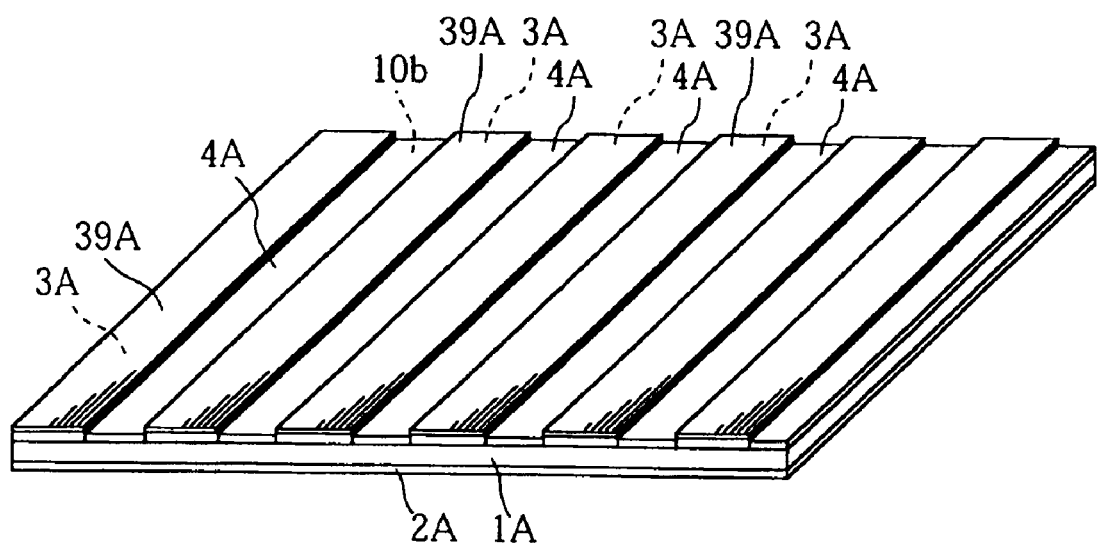

As shown in FIG. 4D, electrically conductive layer 3A is formed in each region between the partitions 4A. Then, a solder layer 39A is formed on each electrically conductive layer 3A. The electrically conductive layer 3A is formed by copper plating for example. The plating method enables to prevent formation of a gap between the formed electrically conductive layer 3A and the partition 4A. Formation of the solder layer 39 is also made by plating.

Figure 4E:
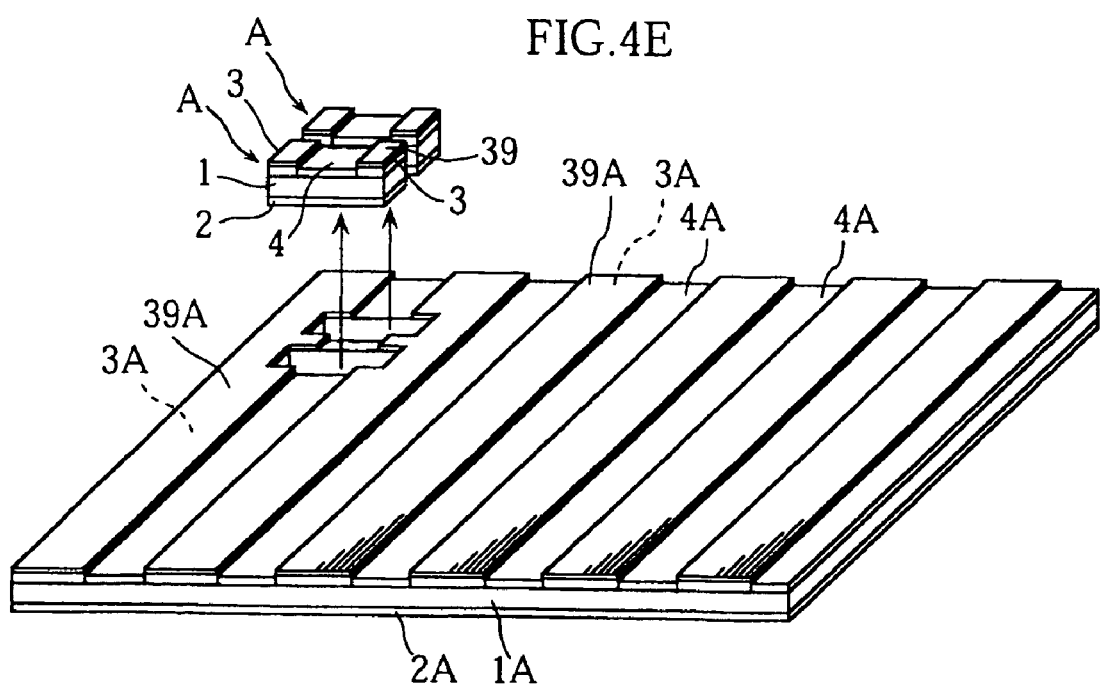
Figure 5:
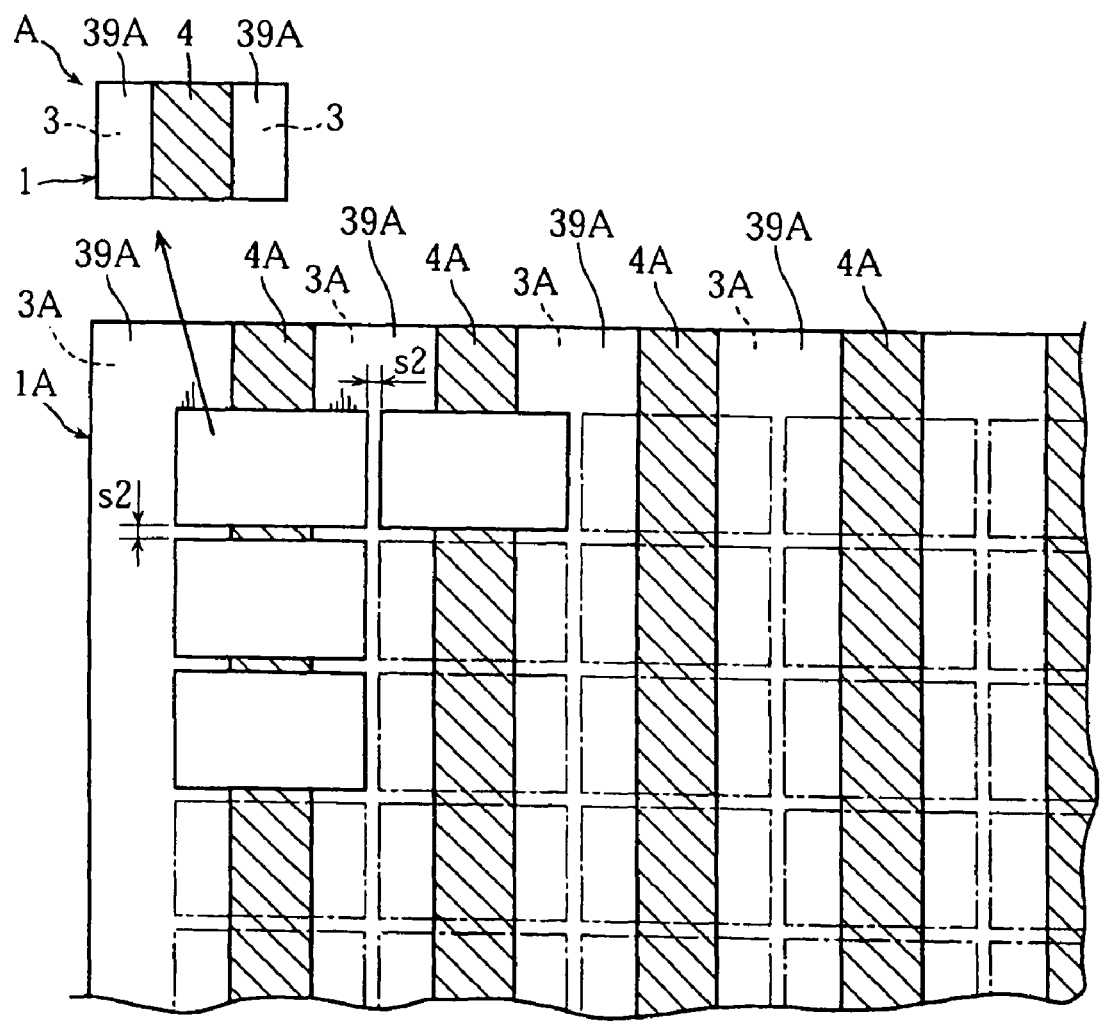

Finally, as shown in FIG. 4E, a blanking operation is made to the plate 1A, whereby a plurality of units (the chip resistors A) are obtained. In this case, it is preferable that one punch die should be used repeatedly so that products will be identical with each other. The rectangular regions which are to be punched out are indicated by long-dashed-short-dashed lines in FIG. 5. One punch-out region is spaced from the adjacent ones by a small, predetermined distance s2.

The chip resistor A manufactured by the method described above is mounted on e.g. a printed circuit board, by means of solder re-flow surface-mounting method. As has been described above, the solder layer 39 and the electrodes 3 protrude downwardly beyond the lower surface of the spacer 4 (See FIG. 2 or FIG. 3). Therefore, it is possible to appropriately mount the resistor A. Further, the resistive element 1 has its upper surface 10a coated with the overcoat layer 2. This enables to prevent the resistive element 1 from being electrically conducted unexpectedly with other conductive members.

According to the above method, the electrically conductive layer 3A (which corresponds to the electrodes 3) is formed after the formation of the partition 4A (which corresponds to the spacer 4) (See FIGS. 4C and 4D). The space between mutually adjacent partitions 4A (which corresponds to s1 in FIG. 2) can be set accurately by the resin thick-film printing. As a result, in each of the final products or the chip resistor A, the electrodes 3 are spaced accurately by a predetermined distance. Further, there is no chance that the plate 1A (resistive element 1) is partially ground mechanically, in the formation of the electrode 3. Thus, the chip resistor A according to the present invention needs no trimming operation which is necessary in the conventional art for the purpose of resistance value adjustment.

Figure 6:
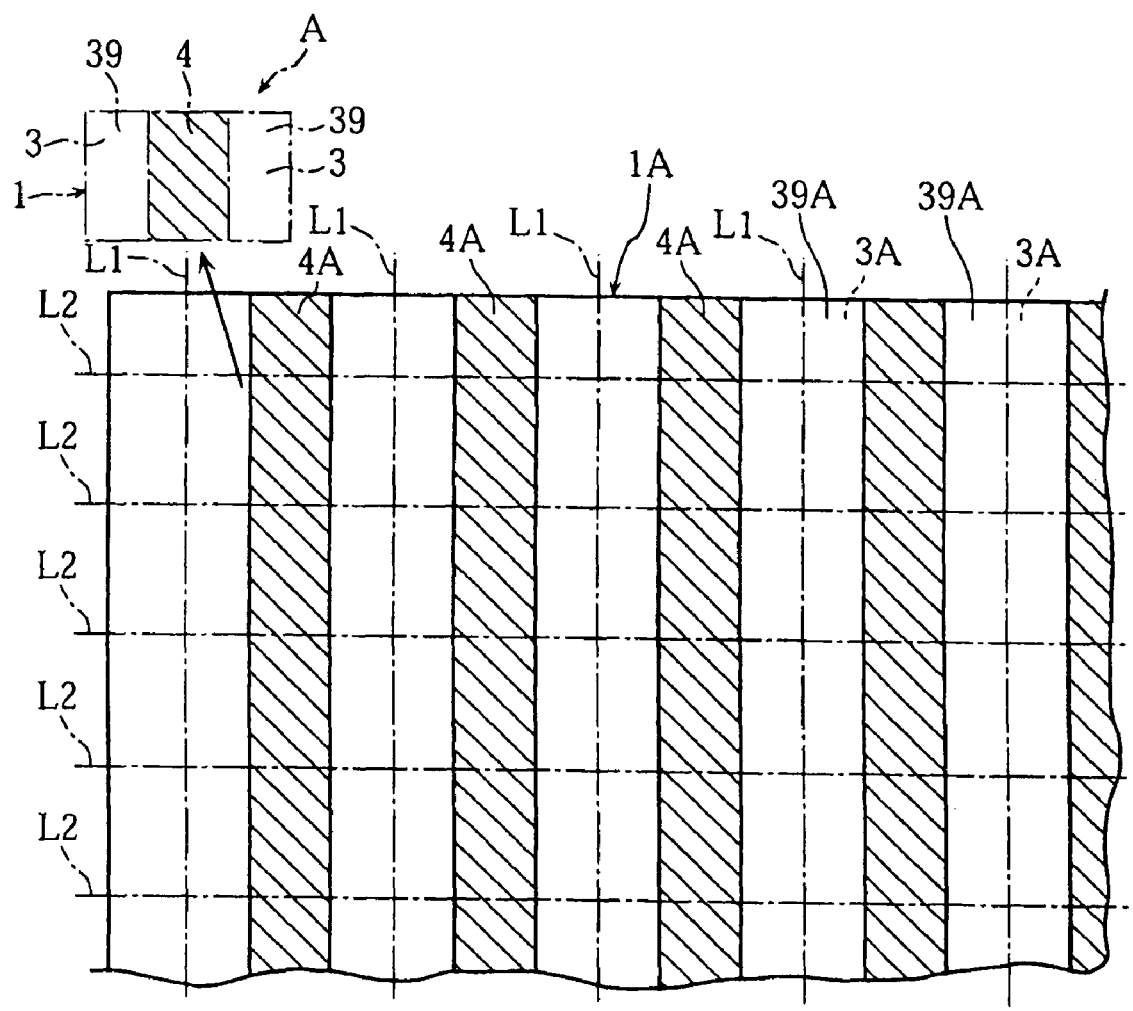

According to the embodiment described above, division into individual resistors is achieved by blanking the plate 1A; however, the present invention is not limited by this. For example, shearing machines and rotary cutters may be used to divide the plate 1A. In this case, the plate 1A is divided along cutting lines L1 and L2 in FIG. 6.

Figure 7A:
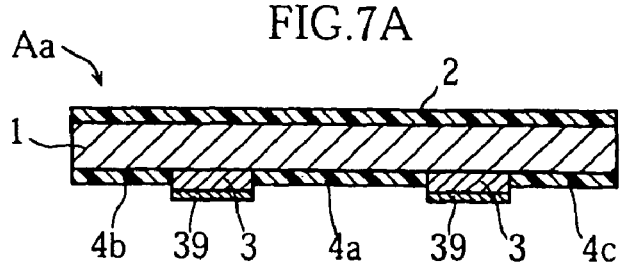
FIG. 7A and FIG. 7B show a chip resistor according to a second embodiment of the present invention.
Figure 7B:
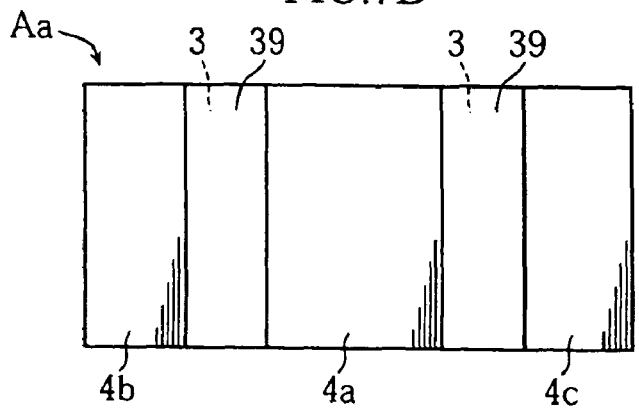
Figure 7C:
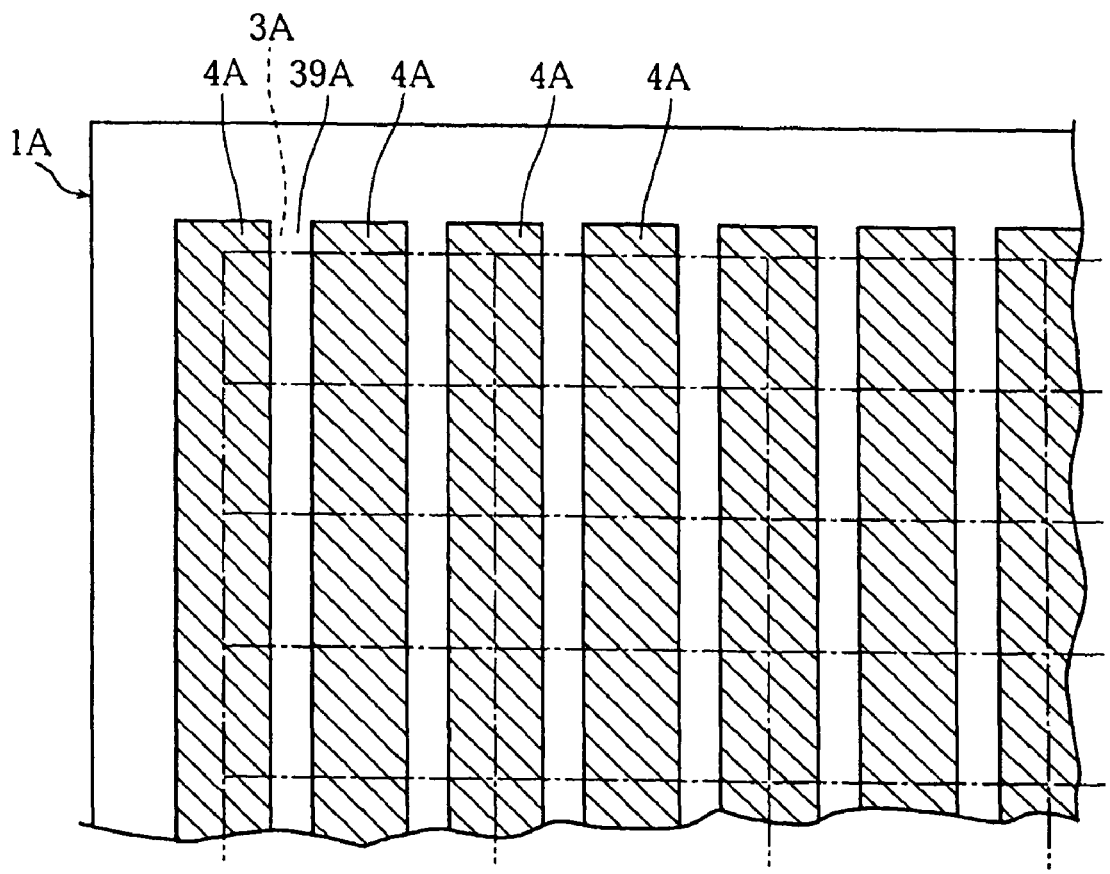
FIG. 7C shows a plate used for manufacturing the chip resistor according to the second embodiment of the present invention.

FIGS. 7A through 7C illustrate a second embodiment of the present invention. In these figures, members which are identical with or similar to those used in the first embodiment are indicated by the same reference codes.

A chip resistor Aa (FIGS. 7A and 7B) according to the second embodiment-basically has the same construction as the resistor A (See FIG. 2) according to the first embodiment, differing however in disposition of the spacer (and therefore disposition of a pair of electrodes 3). Specifically, as shown in FIGS. 7A and 7B, a resistive element 1 has a back surface provided with three spacers 4a-4c which are spaced from each other. Between the spacers 4a, 4b is one electrode 3 whereas between the spacers 4a, 4c is another electrode 3. Each electrode 3 is formed with a solder layer 39.

When manufacturing the chip resistor Aa, a plate 1A shown in FIG. 7C is used. The plate 1A is formed with a plurality of parallel partitions 4A, and between the partitions 4A are formed an electrically conductive layer 3A and a solder layer 39A (as in the first embodiment, the partitions 4A are formed first and thereafter the electrically conductive layer 3A and the solder layer 39A are formed). The plate 1A is cut along the long-dashed-short-dashed lines in the figure, and thus divided into a plurality of individual chips. In place of such a cutting process, a blanking process to the plate 1A may take place.

Figure 8A:
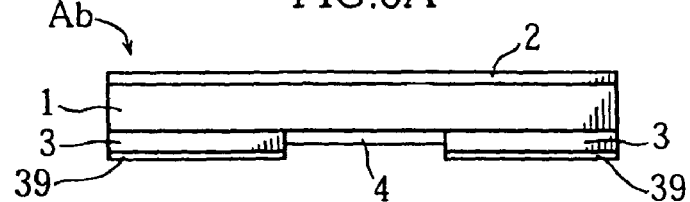
FIG. 8A and FIG. 8B show a chip resistor according to a third embodiment of the present invention.
Figure 8B:
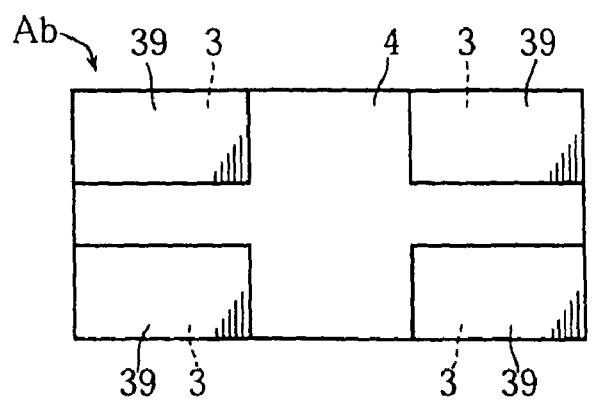
Figure 8C:
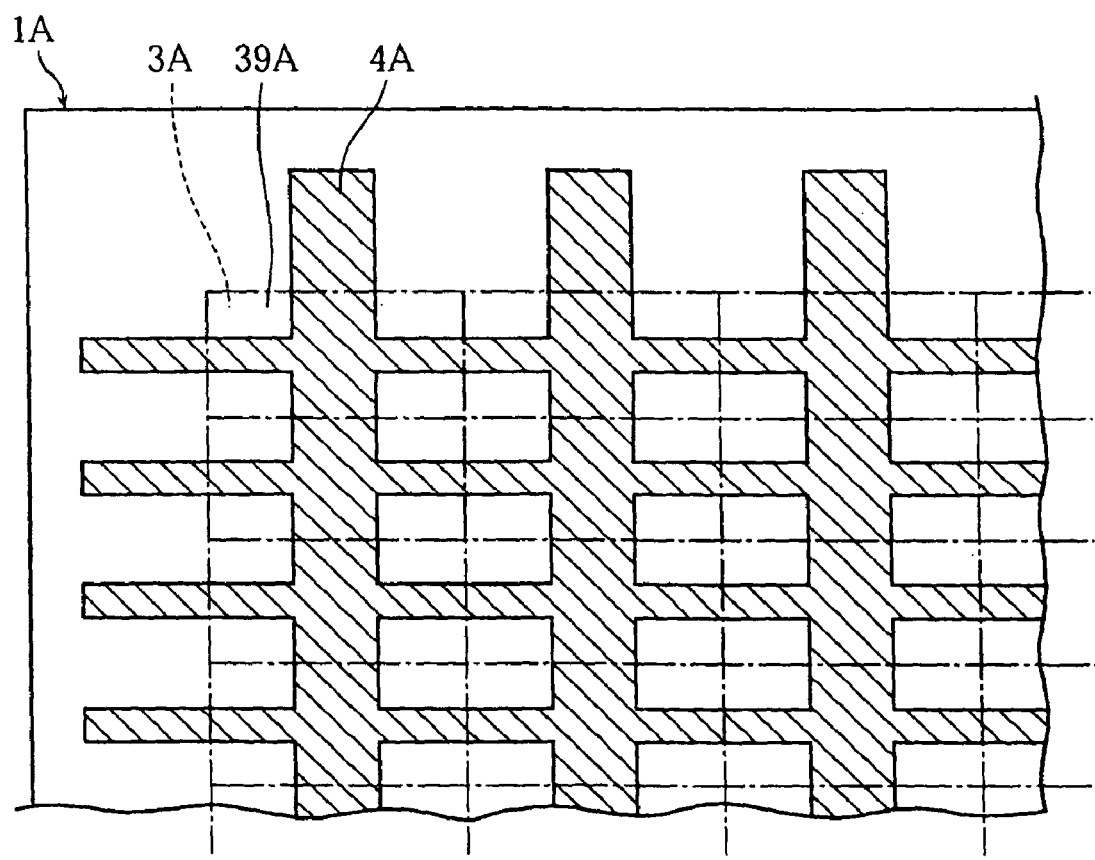
FIG. 8C shows a plate used for manufacturing the chip resistor according to the third embodiment of the present invention.

FIGS. 8A through 8C illustrate a third embodiment of the present invention. As shown in FIG. 8B, a chip resistor Ab according to the third embodiment is formed with a cross-shaped spacer 4, and corresponding to this, the resistor Ab has four electrodes 3. Each electrode 3 is formed with a solder layer 39.

The chip resistor Ab is obtained by cutting a plate 1A shown in FIG. 8C along long-dashed-short-dashed lines. The plate 1A is formed with mesh-like partitions 4A, an electrically conductive layer 3A and a solder layer 39A.

The chip resistor Ab may be used, for example, for measurement of an electric current flowing in a given electric circuit. Specifically, by using two of the four electrodes 3, the chip resistor Ab is connected in series with a target electric circuit. The other two electrodes 3 are connected with a voltmeter. The resistance value of the chip resistor Ab is known. Therefore, based on the voltage given by the voltmeter, the value of the current which flows in the circuit can be calculated (Ohm's law).

Figure 9A:
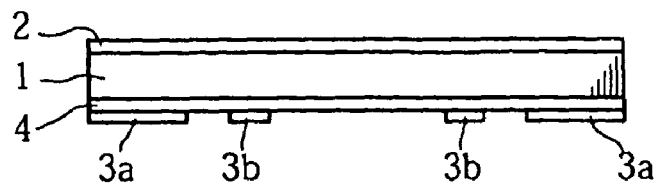
FIGS. 9A-9B show a chip resistor according to the present invention, which has four electrodes.
Figure 9B:
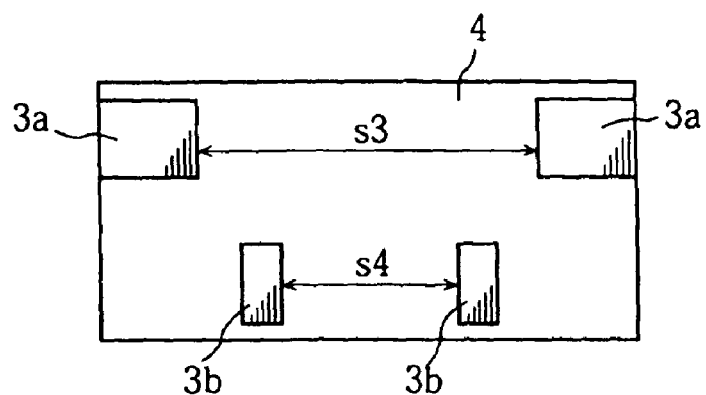
Figure 9C:
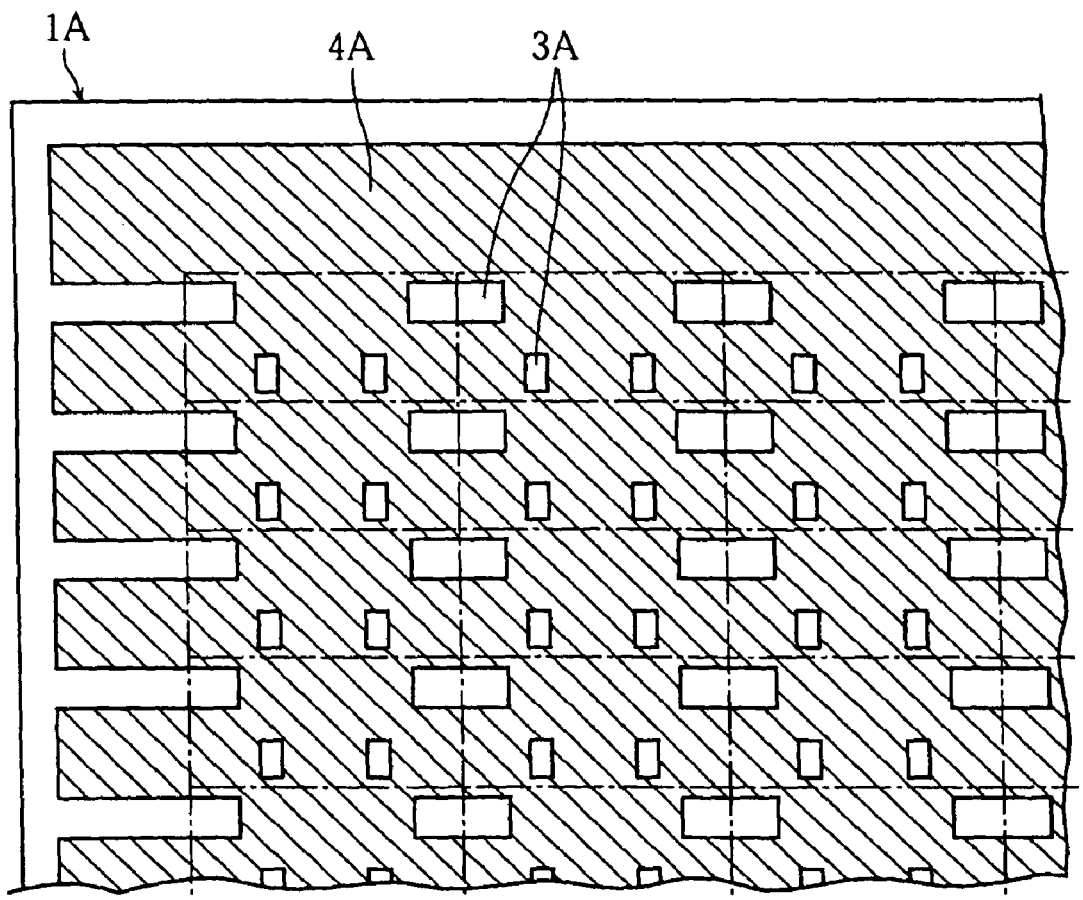
FIG. 9C shows a plate used for manufacturing the chip resistor in FIGS. 9A-9B.
Figure 10A:
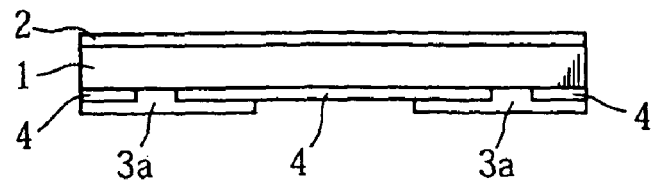
FIGS. 10A-10B show another chip resistor according to the present invention, which has four electrodes.
Figure 10B:
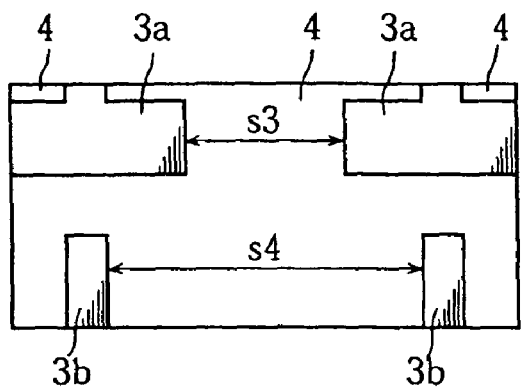
Figure 10C:
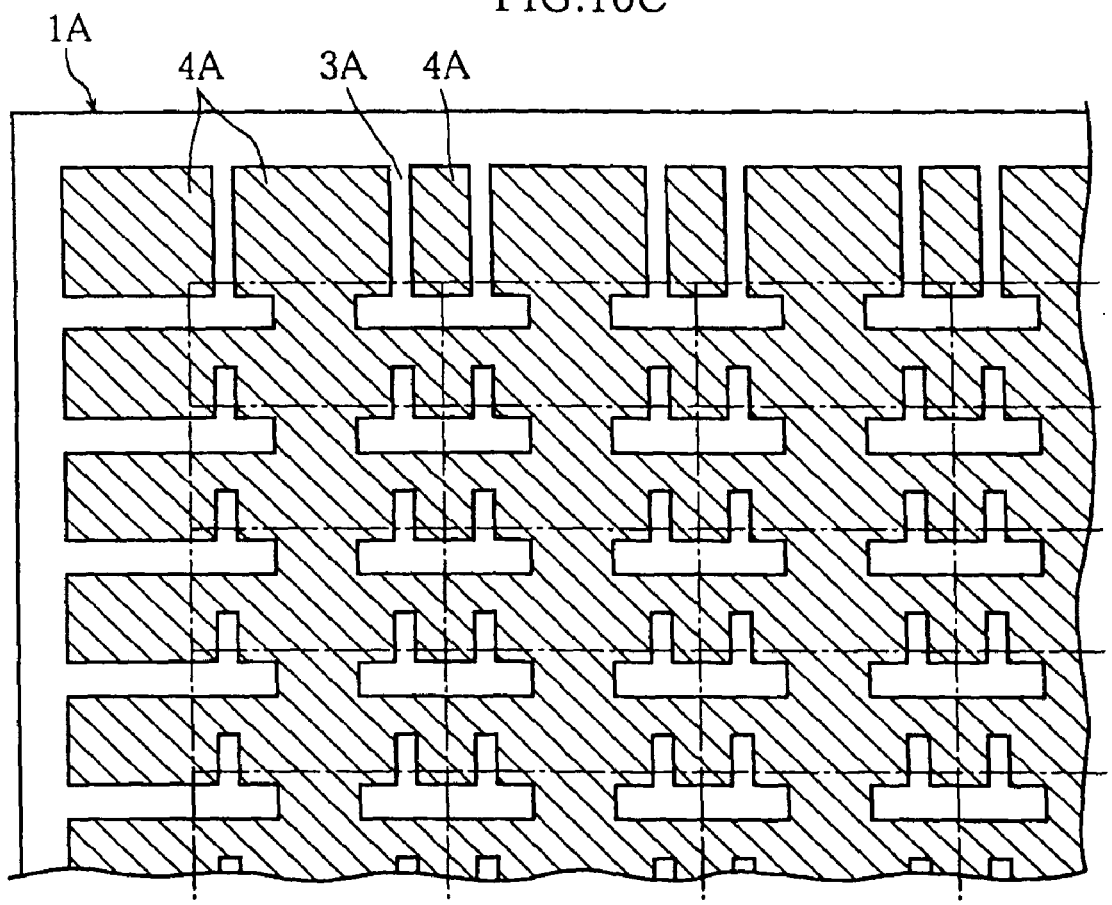
FIG. 10C shows a plate used for manufacturing the chip resistor in FIGS. 10A-10B.
Figure 11A:
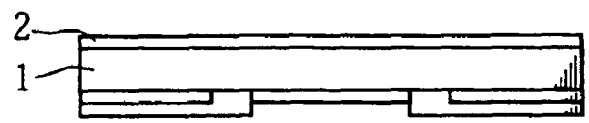
FIGS. 11A-11B show another chip resistor according to the present invention, which has four electrodes.
Figure 11B:
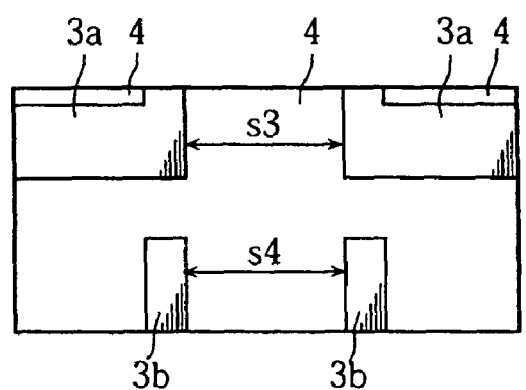
Figure 11C:
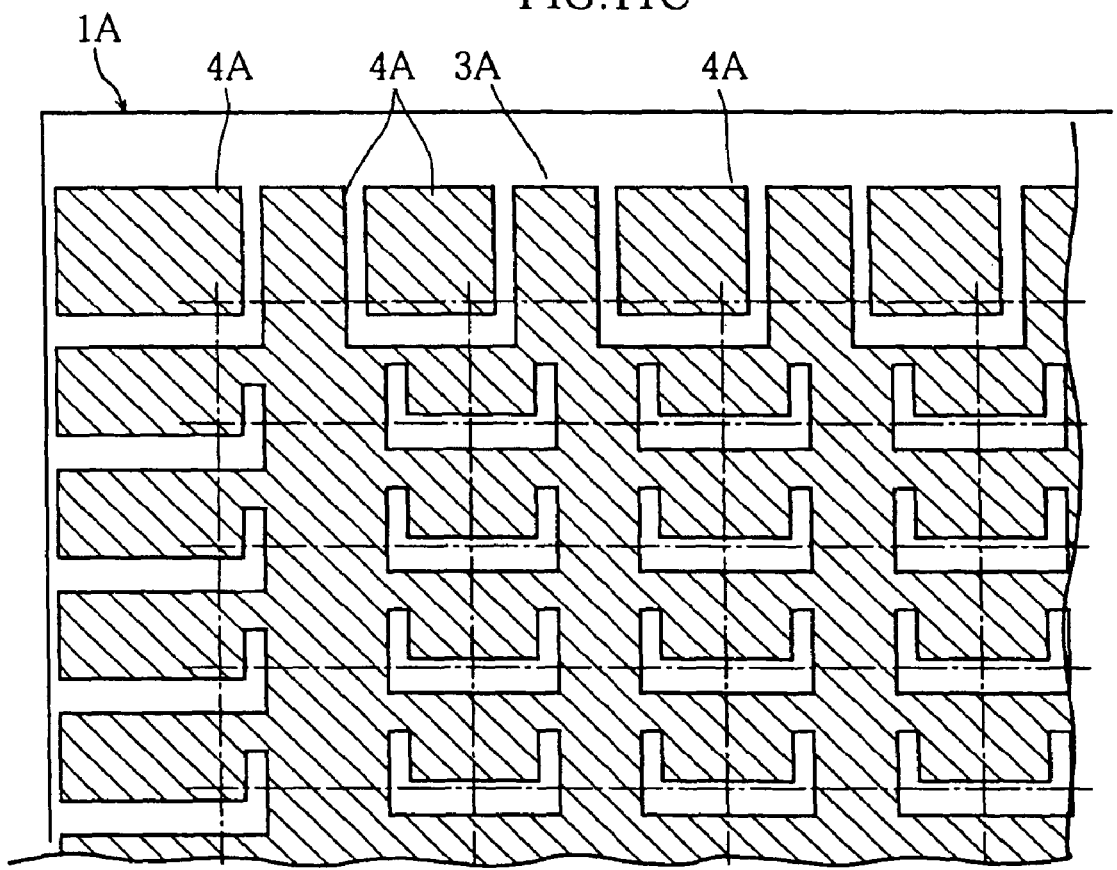
FIG. 11C shows a plate used for manufacturing the chip resistor in FIGS. 11A-11B.

FIGS. 9A-9C, 10A-10C and 11A-11C show other embodiments of the chip resistor which has four electrodes. As will be understood from FIG. 9B, FIG. 10B and FIG. 11B, two electrodes 3a make a pair, and the other two electrodes 3b make another pair. The electrodes 3a are spaced by a distance s3, and the electrodes 3b are spaced by a distance s4. In the resistor in FIG. 9B, the distance s3 is greater than the distance s4. In the resistor in FIG. 10B, the distance s3 is smaller than the distance s4. In the resistor in FIG. 11B, the distance s3 is equal to the distance s4. FIGS. 9C, 10C and 11C show plates 1A used in the manufacture of these three types of the resister respectively. A reference code 4A indicates resin partitions. The plates 1A are cut along predetermined cutting lines (indicated by long-dashed-short-dashed lines).

Figure 12:
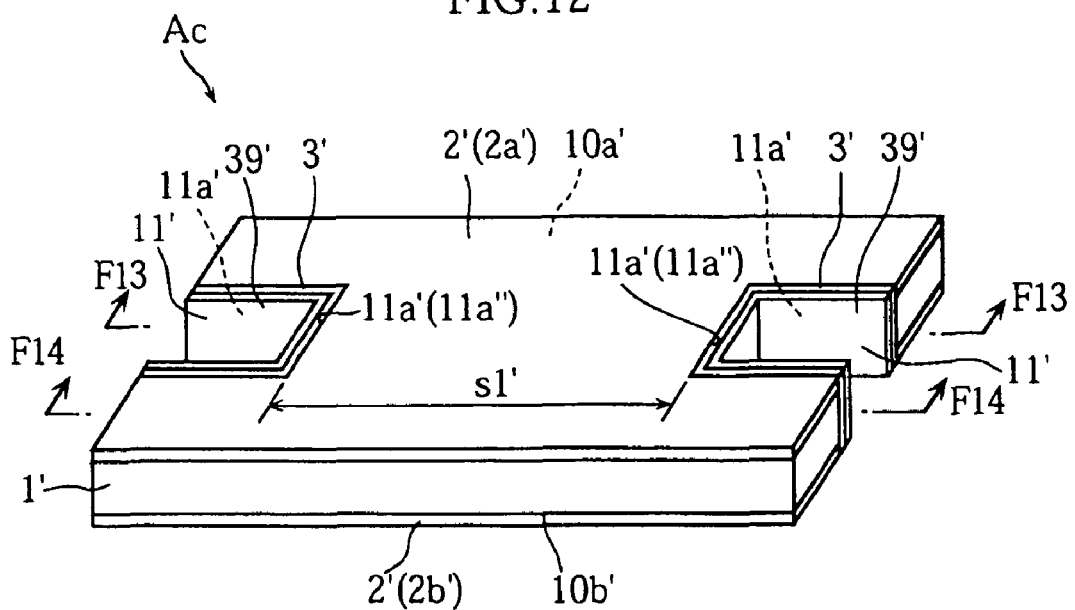
FIG. 12 through FIG. 16B show a chip resistor according to a fourth embodiment of the present invention.
Figure 13:
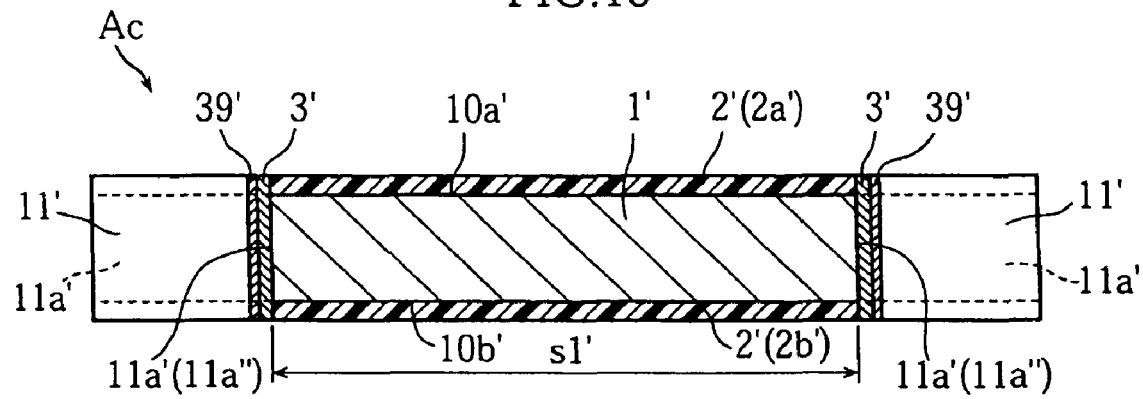
Figure 14:
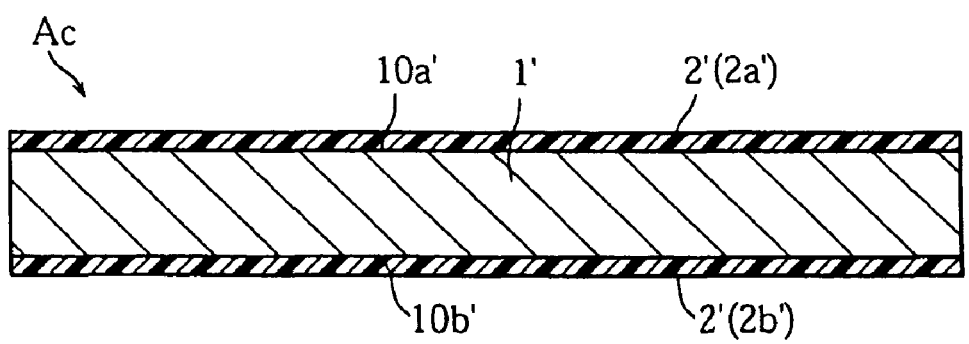

FIG. 12 through FIG. 14 show a chip resistor according to a fourth embodiment of the present invention (the entire resistor is indicated by a reference code Ac). As understood from FIG. 12 and FIG. 13, the chip resistor Ac includes a resistive element 1', insulation layers 2' (2a', 2b') and a pair of electrodes 3'.

The resistive element 1' has a uniform thickness, and is made of a metal material such as a Cu—Mn alloy, a Ni—Cu alloy and a Ni—Cr alloy. Alternatively, the resistive element 1' may be non-metal. As shown in FIG. 12, the resistive element 1' is formed with two recesses 11' which are spaced from each other by a distance s1'.

The insulation layer 2' covers an upper surface 10a' or aback surface 10b' of the resistive element 1'. The insulation layer 2' is made of epoxy resin for example.

The electrode 3' is formed on a plurality of surfaces 11A' of the recess 11' in the resistive element 1'. Therefore, a distance (a minimum distance) between the two electrodes 3' is equal to a distance s1' between the two recesses 11' (or more precisely a distance between two surfaces 11a" that are closest to the center of the resistive element 1', of the surfaces 11a' which form the recesses 11'). The distance s1' is varied in accordance with a target value of resistance. The same applies to the thickness and width of the resistive element 1'. In the chip resistor Ac, the resistance value between the two electrodes 3' lies between 1 mΩ through 100 mΩ for example.

Figure 15:
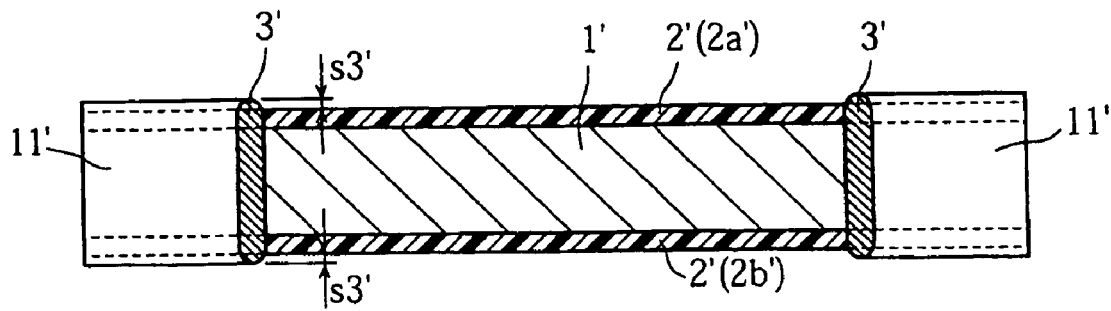
Figure 16A:
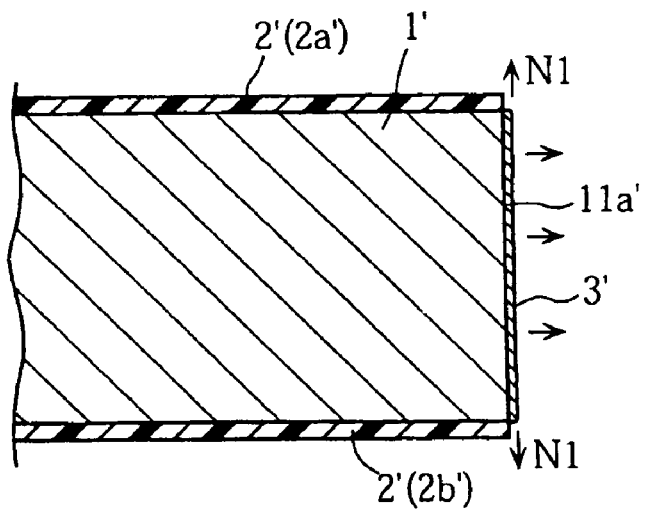
Figure 16B:
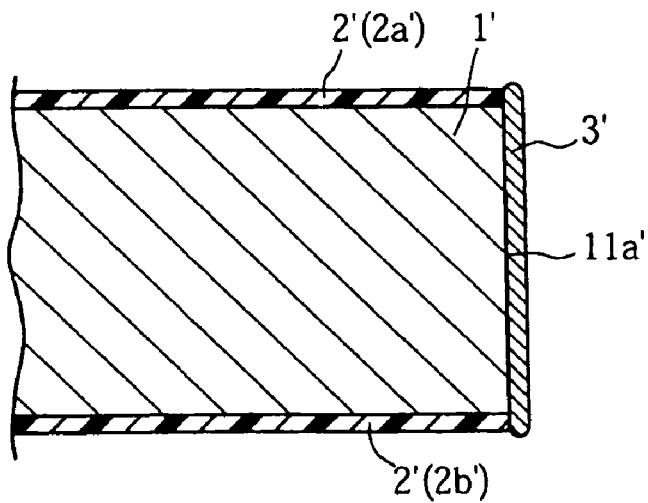

Each electrode 3' has a solder layer 39' formed thereon. Each electrode 3' has its upper and lower edges flush with an outside surface of the respective insulation layers 2a', 2b' (See FIG. 13); however, the present invention is not limited by this. For example, as shown in FIG. 15, each electrode 3' may have its upper edge extending beyond the outside surface of the insulation layer 2a' as well as its lower edge of the electrode extending beyond the outside surface of the insulation layer 2b'. In this figure, the amount of upper and lower extension of the electrodes 3' is indicated by a reference code s3'. Such a construction can be achieved by forming the electrodes 3' through plating. Specifically, as shown in FIG. 16A, while the electrode 3' has a relatively small thickness, the electrode 3' forms only on a side surface 11A' of the resistive element 1'. During the plating process, as the film thickness of the electrode 3' grows, the electrode 3' grows in directions indicated by Arrows N1. As a result, as shown in FIG. 16B, the electrode 3' grows in an upward or downward direction, beyond the insulation layers 2A' or 2B'. The solder layer 39' can also be formed by plating, as is the electrode 3'.

Next, a method of manufacturing the chip resistor Ac will be described with reference to FIG. 17A through FIG. 17E.

Figure 17A:
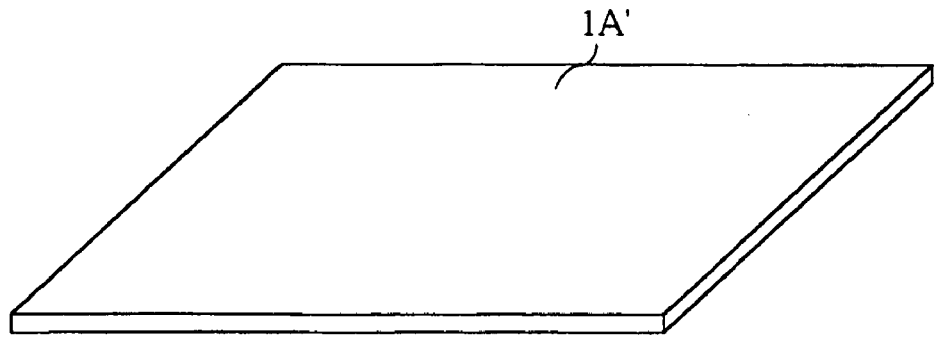
FIG. 17A through FIG. 18 illustrate a method of manufacturing the chip resistor in FIG. 12.
Figure 17B:
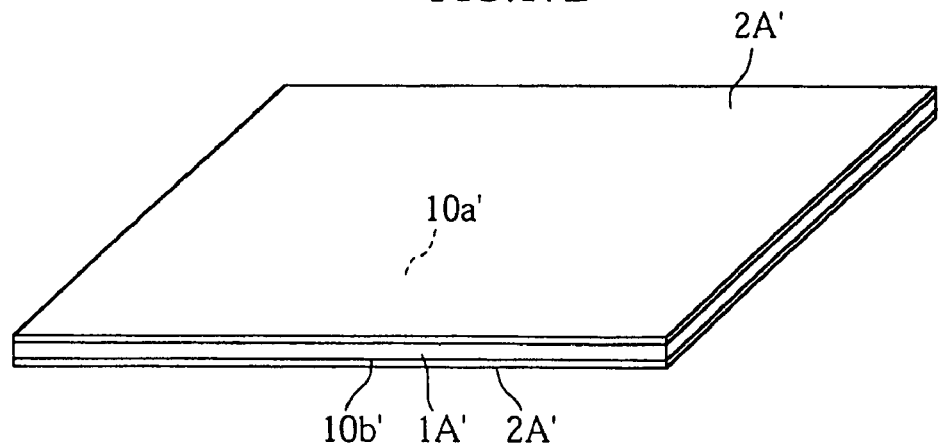

First, as shown in FIG. 17A, a metal plate 1A' which has a uniform thickness is prepared. The plate 1A' is large enough in order to yield a plurality of resistive elements 1'. As shown in FIG. 17B, an insulation layer 2A' is formed on each of an upper surface 10a' and a back surface 10b' of the plate 1A'. The insulation layer 2A' can be formed by applying a resin material onto the upper surface 10a' and the back surface 10b' (using a spin coating method for example).

Figure 17C:
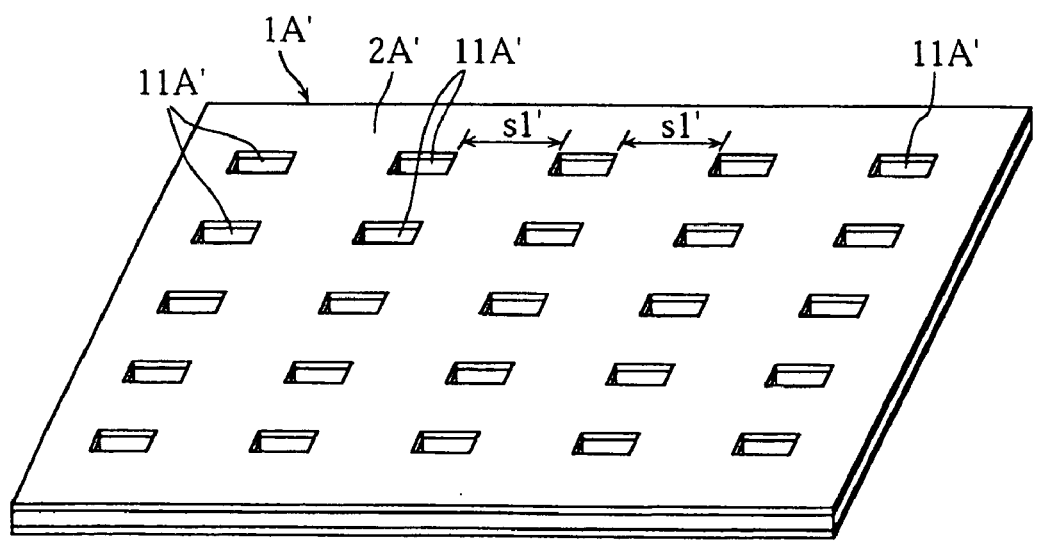

Next, as shown in FIG. 17C, a plurality of rectangular through holes 11A' are formed in the plate 1A' and insulation layers 2A'. These through holes 11A' can be formed by punching in a matrix pattern so they line up in predetermined space from each other. In the right and left directions as of the figure, a distance between two mutually adjacent through holes 11A' in the matrix is identical with an electrode-to-electrode distance s1' (See FIG. 12) described above.

Figure 17D:
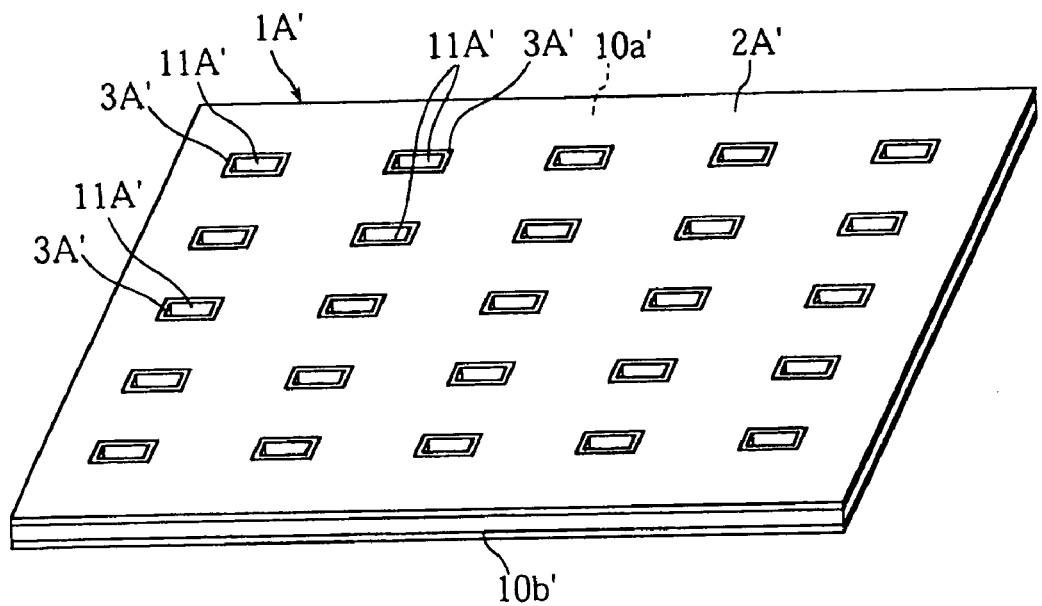

As shown in FIG. 17D, an electrically conductive layer 3A' is formed in an inner wall surface of each through hole 11A', by means of copper plating for example. Then, on each electrically conductive layer 3A', a solder layer (not illustrated) is formed by plating.

Figure 17E:
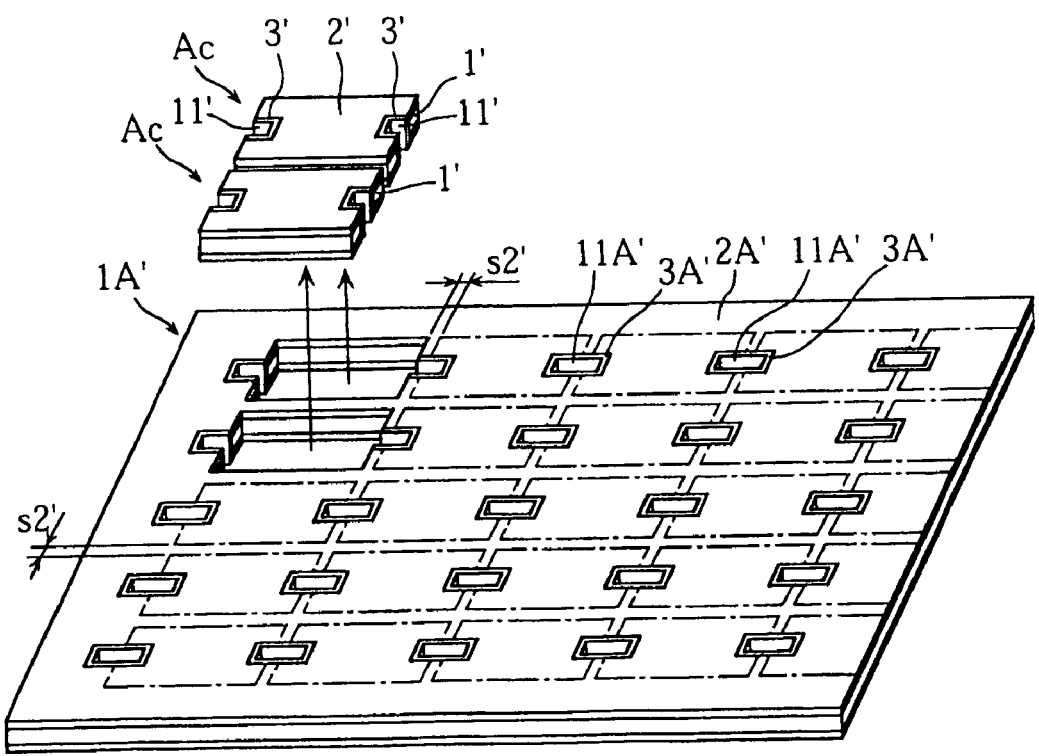

After the plating process, as shown in FIG. 17E, blanking is made repeatedly to the plate 1A', whereby a plurality of chips (resistive elements 1) are obtained from the plate 1A'. In this blanking, a single punch die (not illustrated) is used so that products will be of an identical size with each other. In the figure, punch-out regions are indicated by long-dashed-short-dashed lines.

The chip resistor Ac is mounted on a desired object (e.g. a printed circuit board) by means of a solder re-flow method for example. As has been described above, lower edges of the solder layer 39' and the electrode 3' are flush with or protrude downwardly beyond the lower surface of the spacer 4. Further, the electrodes 3' are formed on a plurality of surfaces 11A', so the lower end surface of the electrodes 3' has a greater area than in a case where e.g. only one of the surfaces 11A' is formed with the electrode 3'. Therefore, it is possible to appropriately solder the resistor Ac onto the printed circuit board.

The upper surface 10a' and the back surface 10b' of the resistive element 1' is covered by the insulation layers 2'. Thus, the resistive element 1' is prevented from unwanted electrical contact with other members or components.

According to the method of manufacturing the chip resistor Ac described above, it is possible to form the electrodes 3' without inappropriately altering the resistance value of the resistive element 1'. Therefore, resistor Ac does not need any trimming operation for resistance value adjustment, and it becomes possible to reduce manufacturing cost accordingly.

Figure 18:
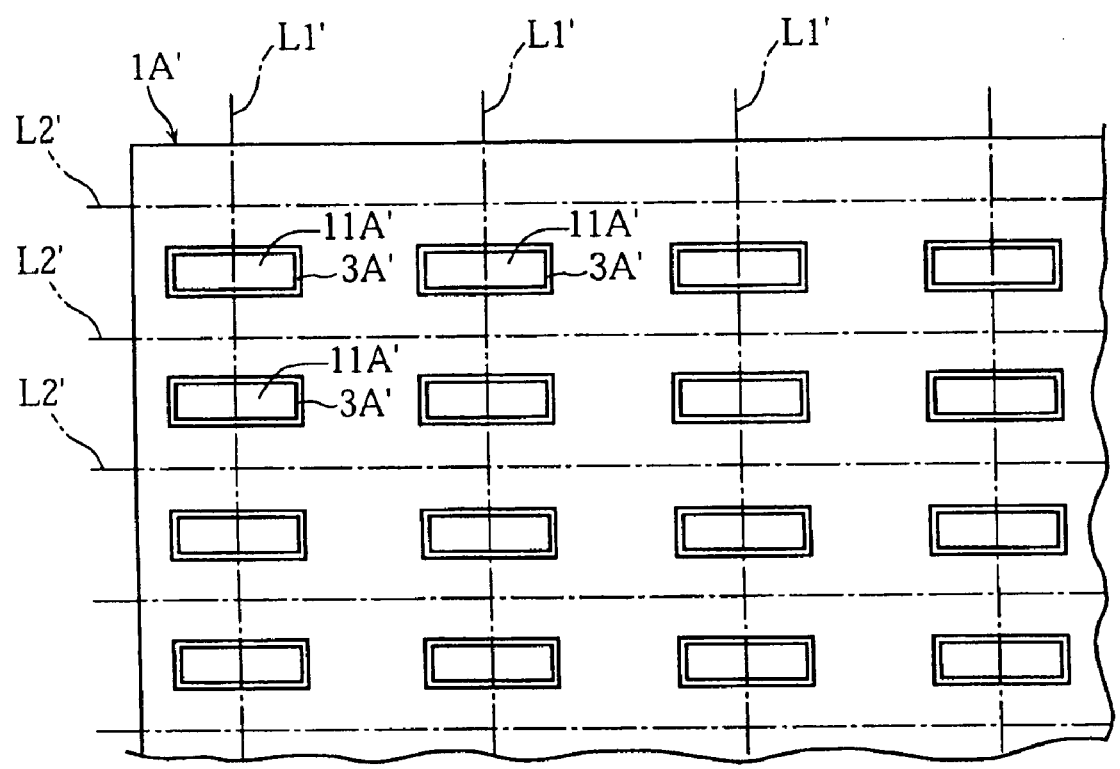

According to the manufacturing method described above, division of the plate 1A' is achieved by blanking the plate 1A. Alternatively however, shearing machines and rotary cutters may be used to divide the plate 1A along cutting lines L1' and L2' in FIG. 18.

Figure 19A:
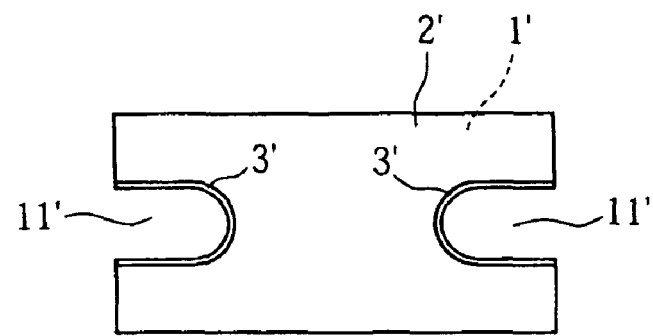
FIG. 19A through FIG. 25E illustrate variations of the present invention.
Figure 19B:
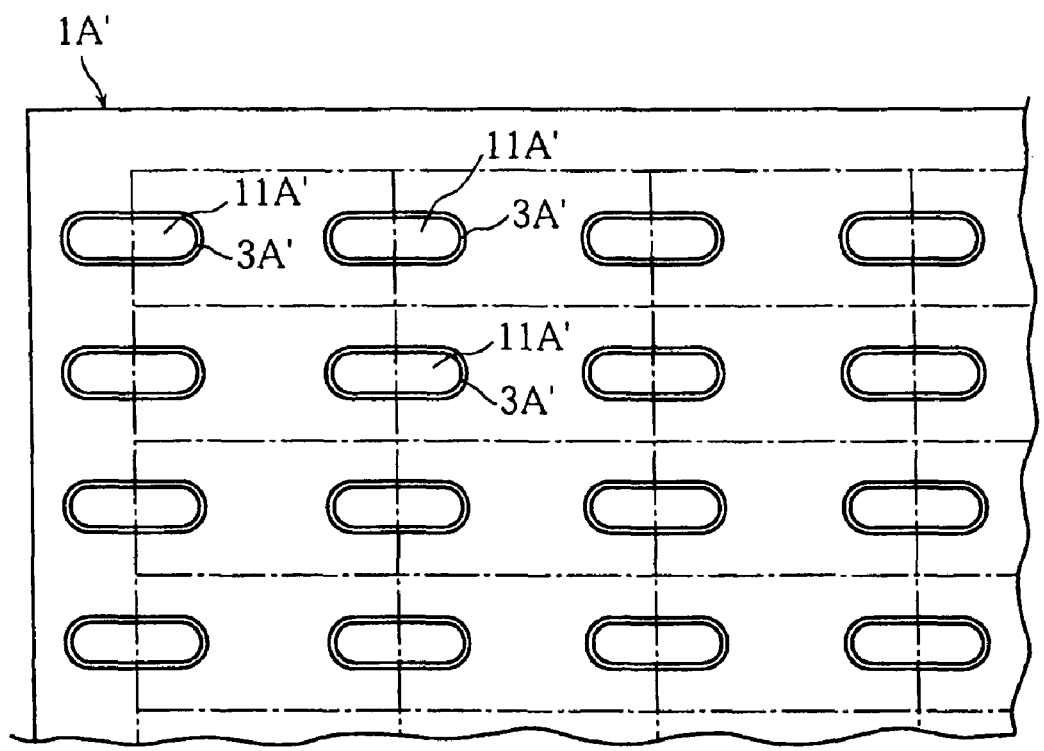

The shape of the recess 11' in the resistive element 1' (See FIG. 12) may not necessarily be rectangular. For example, as shown in FIG. 19A, each recess 11' may have a semicircular wall surface. In this case, a plate 1A' shown in FIG. 19B is cut along cutting lines (long-dashed-short-dashed lines). A reference code 11A' indicates a through hole formed in the plate 1A'. Each through hole 11A' has two semicircular wall surfaces separated from each other. A reference code 3A' indicates an electrically conductive layer formed in the through hole 11A'.

Figure 20A:
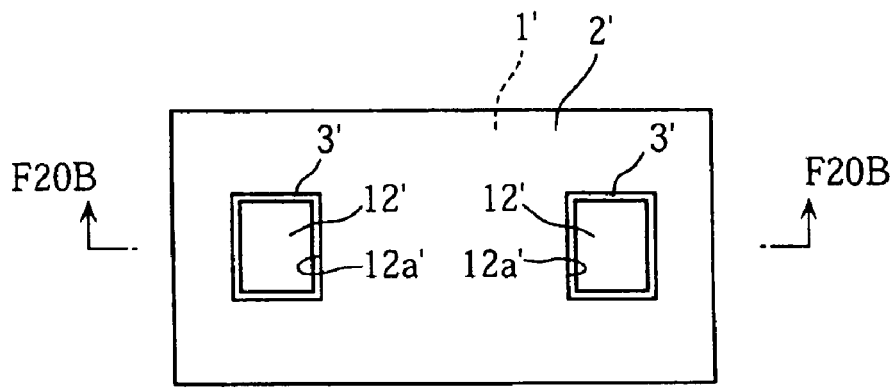
Figure 20B:
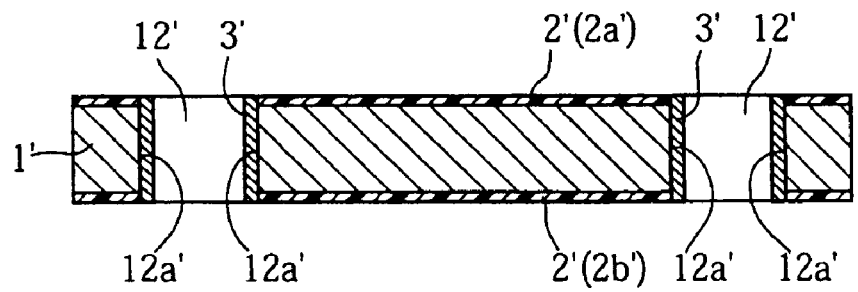
Figure 20C:
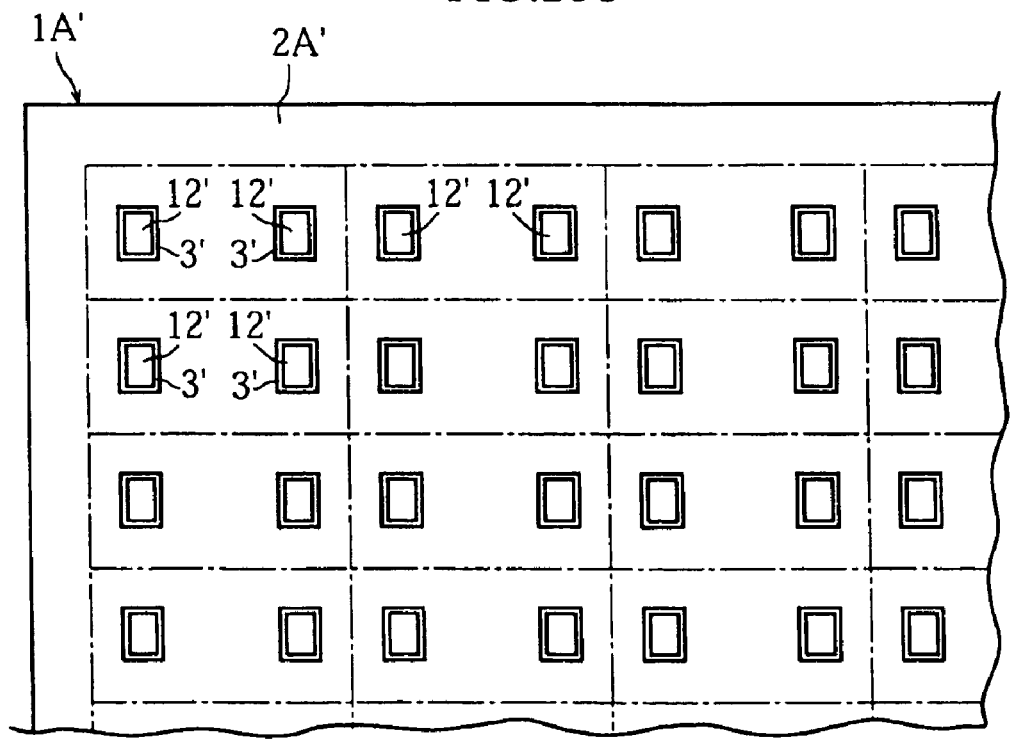

A resistor shown in FIGS. 20A and 20B is essentially the same as the chip resistor Ac (FIGS. 12 and 13), differing only in that the recesses 11' are replaced by rectangular through holes 12' formed in the resistive element 1'. Each through hole 12' has an inner wall surface 12a' formed with an electrode 3'. Such a chip resistor is obtained by cutting a plate 1A' which is shown in FIG. 20C, along long-dashed-short-dashed lines.

Figure 21A:
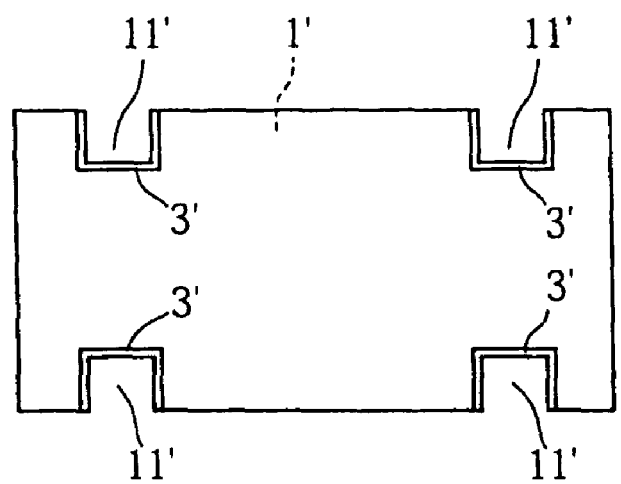
Figure 21B:
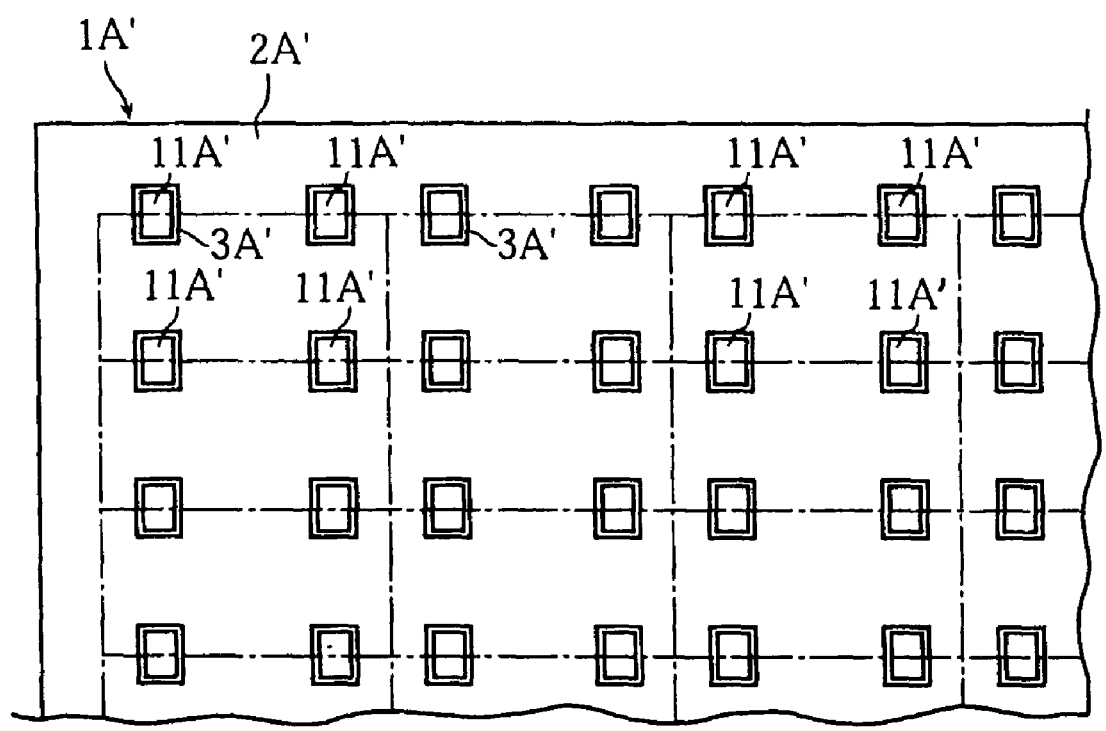

A chip resistor shown in FIG. 21A includes a resistive element 1' which is formed with four recesses 11'. Each recess 11' is formed with an electrode 3'. Such a chip resistor is obtained by cutting a plate 1A' shown in FIG. 21B, along long-dashed-short-dashed lines. A reference code 11A' indicates a through hole which has a rectangular section. Each through hole 11A' is formed with an electrically conductive layer 3A'. A resistor in FIG. 21A has four electrodes, and so can be used for measurement of an electric current in an electric circuit, as is the chip resistor Ab (See FIGS. 8A and 8B).

Figure 22A:
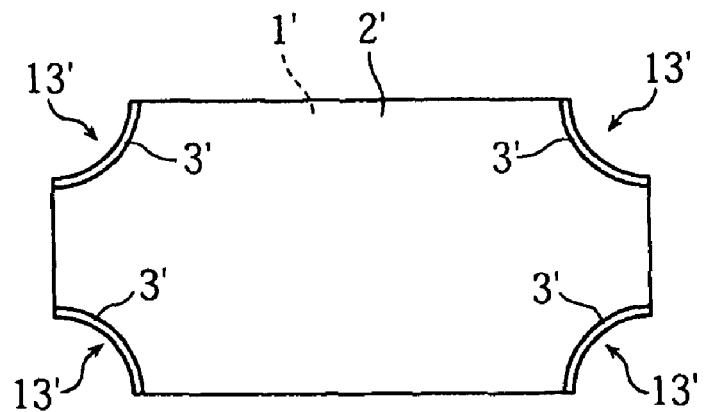
Figure 22B:
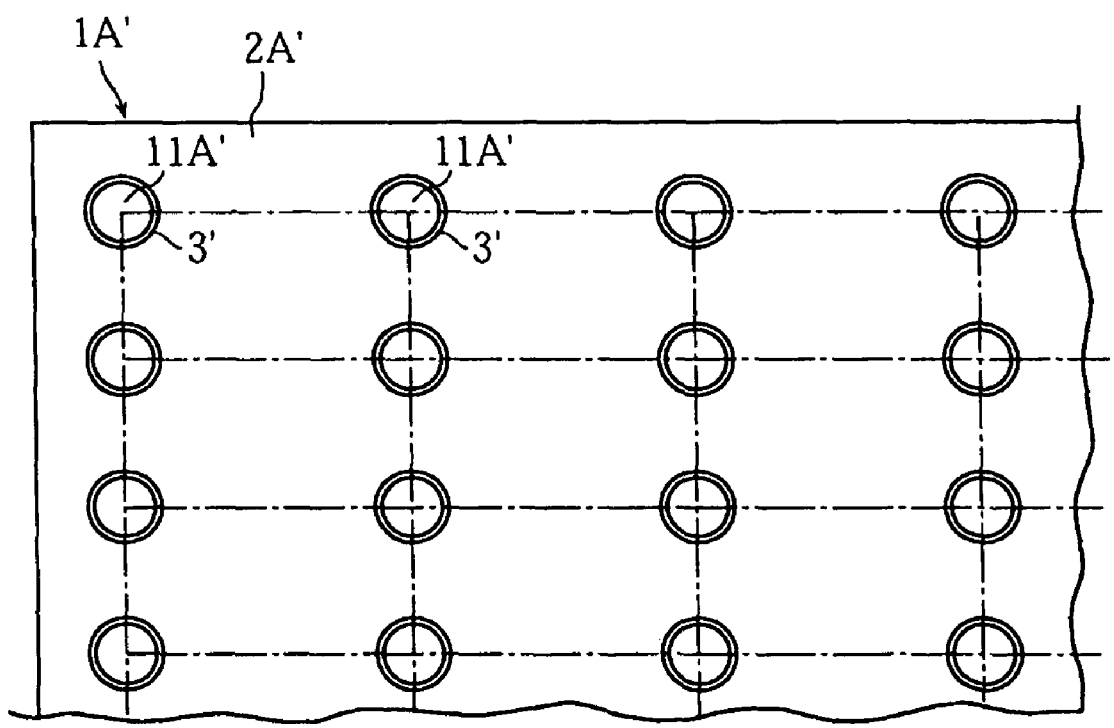
Figure 23A:
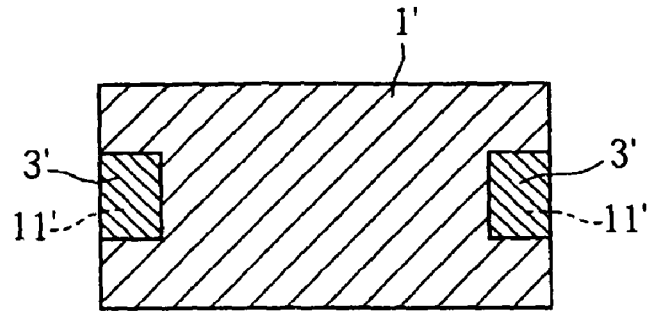
Figure 23B:
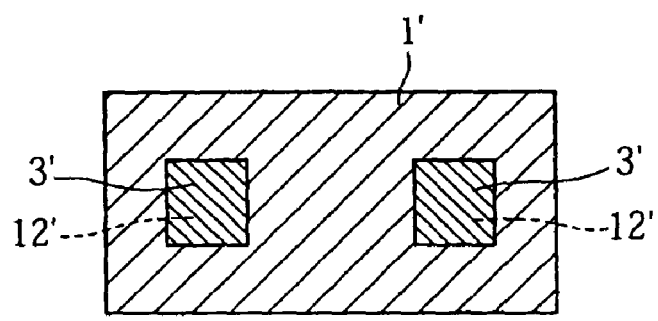
Figure 23C:
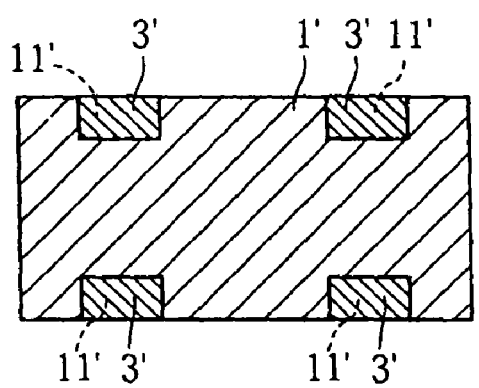
Figure 23D:
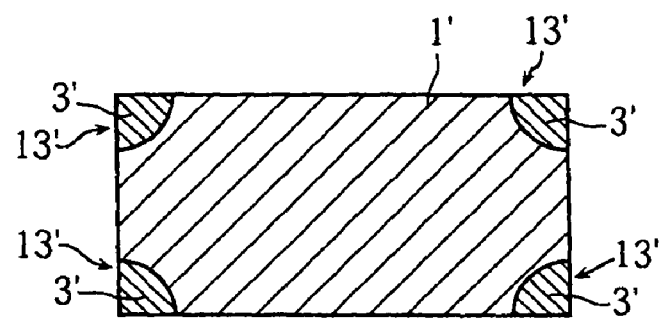

A chip resistor shown in FIG. 22A is rectangular, in which each of the four corner regions is made into an arc-shaped electrode 3'. Such a chip resistor is obtained by cutting a plate shown in FIG. 22B along long-dashed-short-dashed lines. A reference code 11A' indicates a through hole which has a round section.

Chip resistors shown in FIGS. 23A-23D correspond to the chip resistors in FIGS. 12, 20A, 21A and 22A respectively. In the resistors shown in FIGS. 23A-23C, each electrode 3' fills up a recess 11' or a through hole 12' in a resistive element 1'. In a resistor shown in FIG. 23D, an electrodes 3' provided at each corner region 13' integrates with the resistive element 1', to make a complete rectangle.

Constructions shown in FIGS. 23A-23D can be achieved by increasing the thickness of a metal coating which is formed in the plating process. According to the above construction, it is possible to give the electrode 3' a large bonding area. As a result, it becomes possible to increase the strength of solder bonding to the electrode 3', reduce electric resistance of the electrode 3' itself, and so on.

Figure 24A:
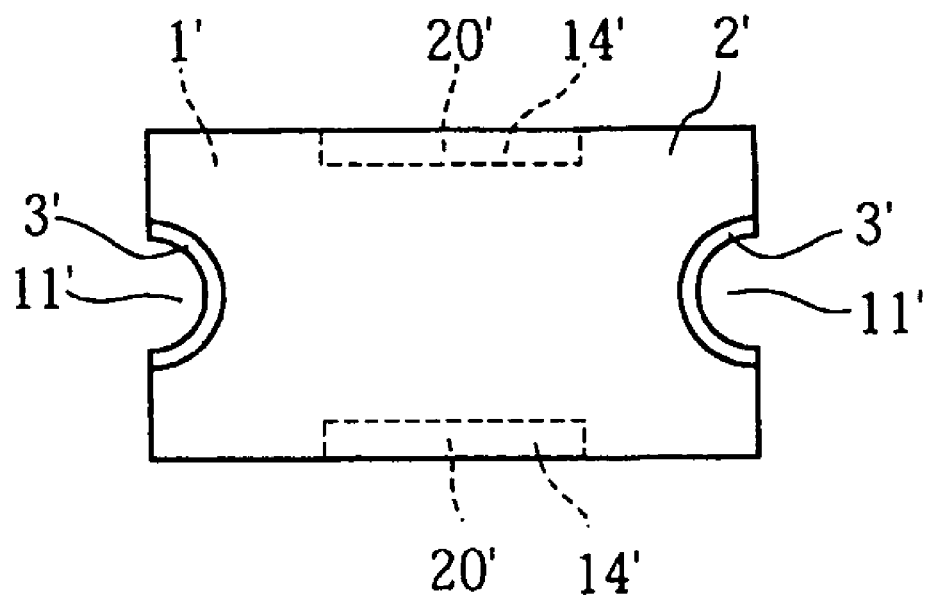
Figure 24B:
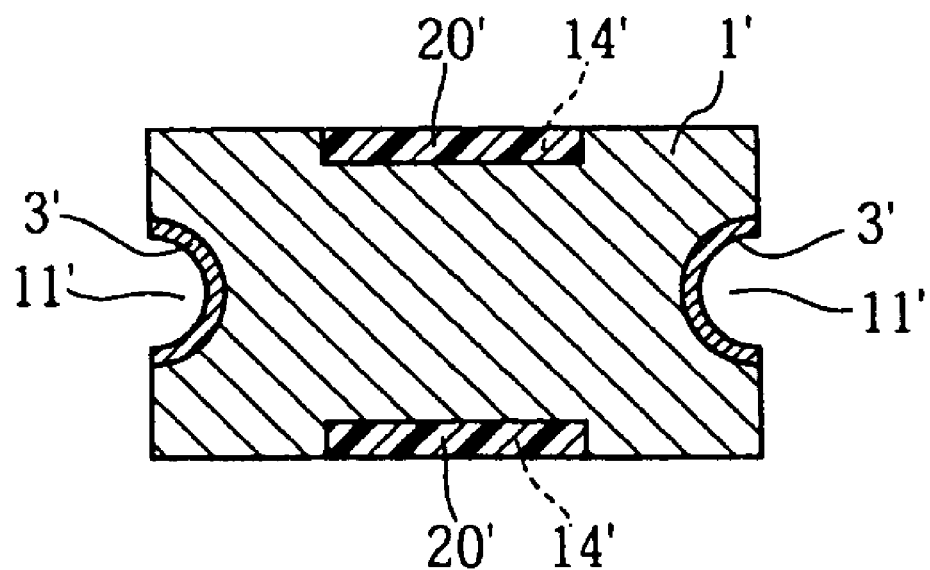

Chip resistors shown in FIGS. 24A and 24B are similar to the one in FIG. 19A in its basic construction, differing however in that a resistive element 1' has a pair of side edges provided with a pair of cutouts 14'. The cutouts 14' are for resistance value adjustment of the resistive element 1'. As shown in FIG. 24B, each cutout 14' is filled with a resin member 20'. The resin member is made of the same resin as the insulation layers 2'.

Figure 25A:
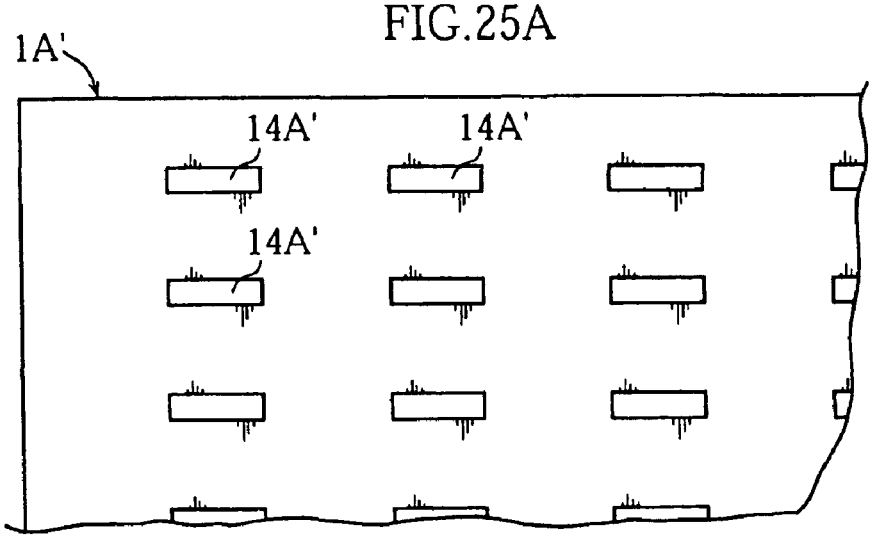
Figure 25B:
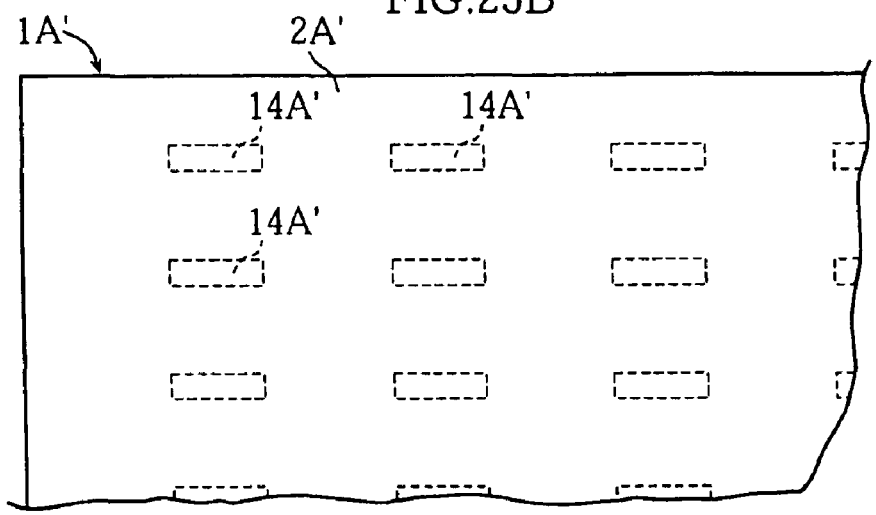
Figure 25C:
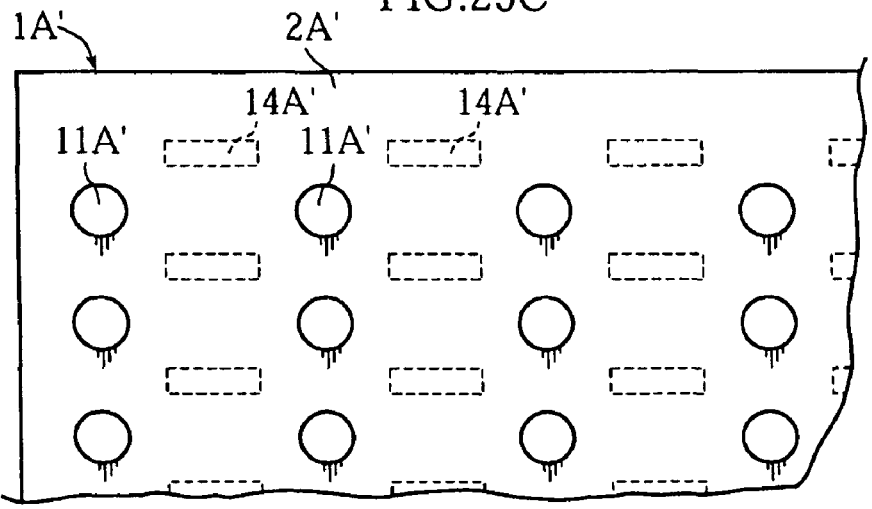
Figure 25D:
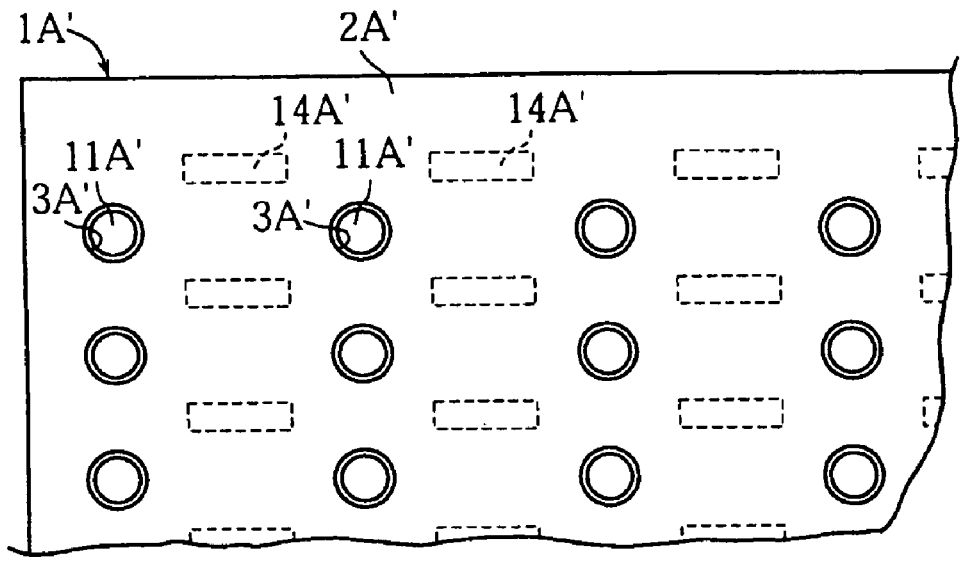
Figure 25E:
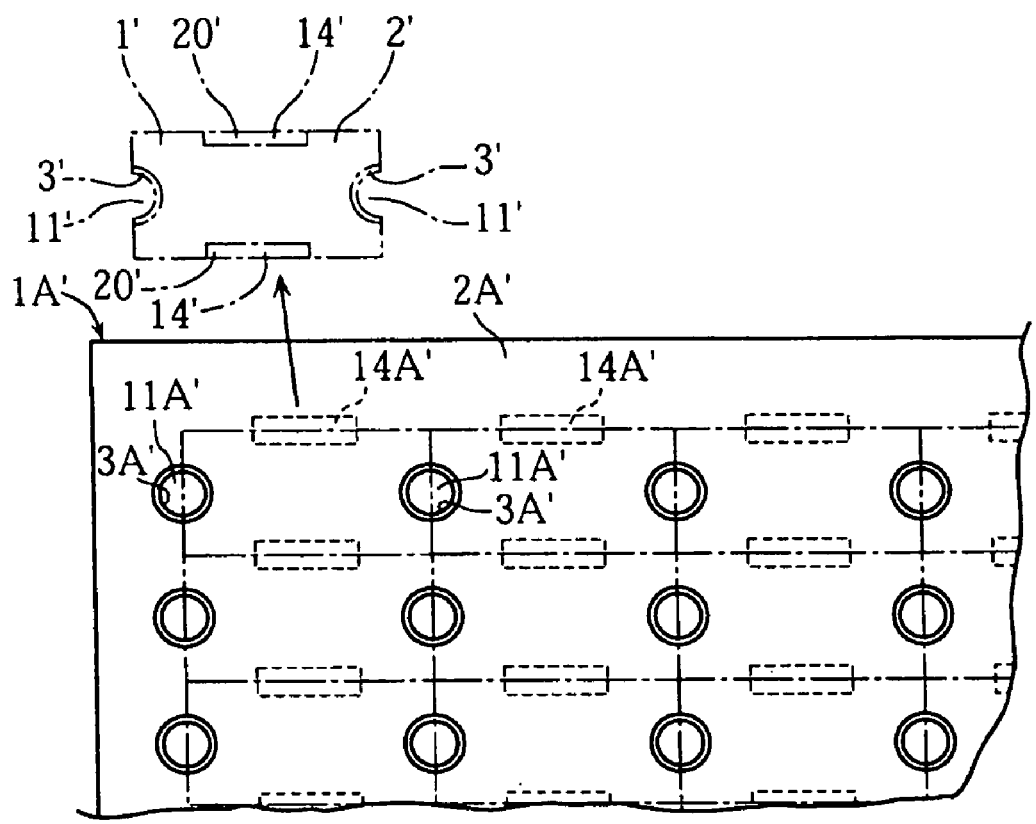
Figure 26:
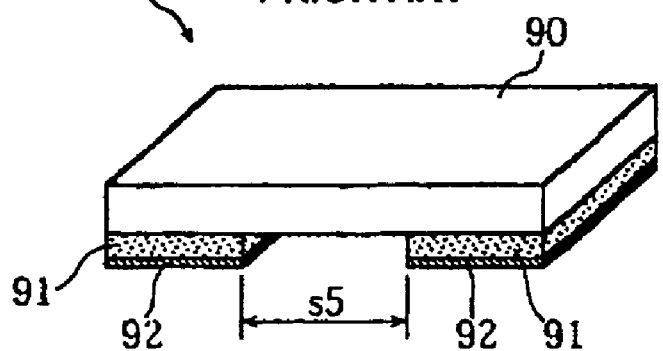
FIG. 26 is a perspective view of a conventional chip resistor.
Figure 27A:
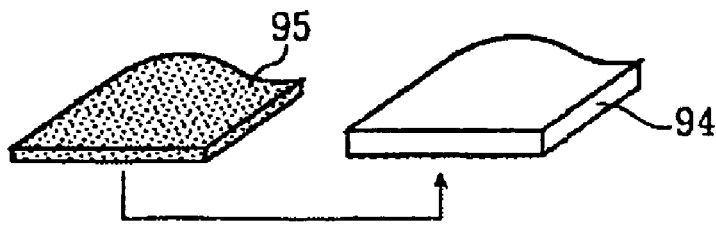
FIGS. 27A-27E illustrates a method of manufacturing the conventional chip resistor.
Figure 27B:
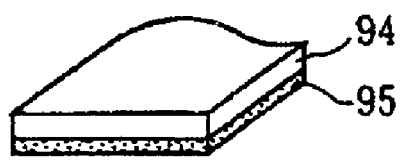
Figure 27C:
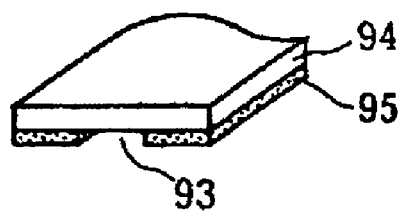
Figure 27D:
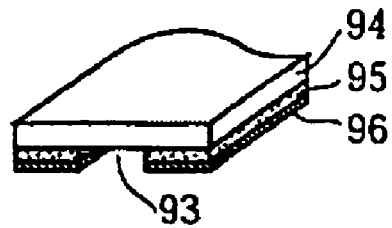
Figure 27E:
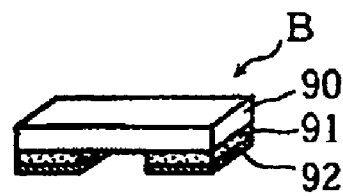

The resistors in FIGS. 24A and 24B can be manufactured as follows: First, as shown in FIG. 25A, through holes 14A' are punched out in a plate 1A'. Next, as shown in FIG. 25B, a resin is applied on an upper and a lower surfaces of the plate 1A' to form insulation layers 2'. In this step, the resin is filled into each through hole 14A'. Then, as shown in FIG. 25C and FIG. 25D, through holes 11A' are formed in the plate 1A', and an electrically conductive layer 3A' is formed in each of the through holes 11A'. Finally, as shown in FIG. 25E, the plate 1A' is cut along cutting lines (long-dashed-short-dashed lines).

The present invention having been described thus far, it is obvious that the invention can be varied in many ways. Such variations should not be considered as deviations from the spirit and scope of the present invention, and all of these changes obvious to those skilled in the art should be included in the scope of the following claims.

The invention claimed is:

1. A chip resistor comprising:
a chip-like resistive element including an upper surface and a lower surface facing away from the upper surface in a direction of thickness; and
a plurality of electrodes provided on the resistive element;
wherein the resistive element includes a plurality of upright surfaces extending in the direction of thickness, each of the electrodes being provided correspondingly in one of the upright surfaces; and
wherein the resistive element also includes a side edge different from the upright surfaces, the side edge being formed with a resistance adjusting cutout.

2. The resistor according to claim 1, wherein the resistive element includes a plurality of recesses formed by the upright surfaces.

3. The resistor according to claim 2, wherein the recesses are filled by the electrodes.

4. The resistor according to claim 1, wherein the resistive element includes an opposing pair of side edges, each formed with the resistance adjusting cutout.

5. The resistor according to claim 1, wherein the resistance adjusting cutout is filled with a resin member.

* * * * *